United States Patent [19]

Kakimoto

[11] Patent Number: 5,661,741
[45] Date of Patent: Aug. 26, 1997

[54] SEMICONDUCTOR LIGHT EMITTING DEVICE, LASER AMPLIFIER, AND INTEGRATED LIGHT AMPLIFIER AND WAVELENGTH VARIABLE FILTER

[75] Inventor: Syoichi Kakimoto, Itami, Japan

[73] Assignee: Mitsubishi Denki Kabushiki Kaisha, Tokyo, Japan

[21] Appl. No.: 444,521

[22] Filed: May 19, 1995

[30] Foreign Application Priority Data

Jun. 7, 1994 [JP] Japan ..................................... 6-124830

[51] Int. Cl.$^6$ ..................................... H01S 3/19
[52] U.S. Cl. ..................................... 372/46; 372/45
[58] Field of Search ..................................... 372/45, 46

[56] References Cited

U.S. PATENT DOCUMENTS 5,073,805  12/1991  Nomura et al. ..................... 357/17

FOREIGN PATENT DOCUMENTS

| 0044571 | 1/1982 | European Pat. Off. . |
|---------|--------|----------------------|
| 0549103 | 6/1993 | European Pat. Off. . |
| 0575684 | 12/1993 | European Pat. Off. . |
| 61-181185 | 8/1986 | Japan . |
| 62-165388 | 7/1987 | Japan . |
| 388382 | 4/1991 | Japan . |
| 0213705 | 3/1987 | United Kingdom . |

OTHER PUBLICATIONS

Wang et al., "New Materials for Diode Laser Pumping of Solid–State Lasers", IEEE Journal of Quantum Electronics, vol. 28, No. 4, Apr. 1992, pp. 942–951.

Sze, "Physics Of Semiconductor Devices", Wiley–Interscience, pp. 38 and 41 (No Date).

Shimazu et al, "Wavelength–Division–Multiplexing Optical Switch Using Acoustooptic Deflector", Journal of Lightwave Technology, vol. Lt–5, No. 12, 1987, pp. 1742–1747.

Wood, "Multiple Quantum Well (MQW) Waveguide Modulators", Journal of Lightwave Technology, vol. 6, No. 6, 1988, 743–757.

Teich et al, "Photon–Number–Squeezed Recombination Radiation In Semiconductors", Journal of the Optical Society of America, vol. 4, No. 10, 1987, pp. 1663–1666.

Kakimoto et al, "Wavelength Dependence Of Characteristics Of 1.2–1.55 μm InGaAsP/InP Substrate Buried Crescent Laser Diodes", IEEE Journal of Quantum Electronics, vol. QE–24, No. 1, 1988, pp. 29–35.

Numai et al, "Tunable Wavelength Filters Using λ/4–Shifted Wave–guide Grating Resonators", Applied Physics Letters, vol. 53, No. 2, 1988, pp. 83–85.

"Properties Of Indium Phosphide", No. 6, 1990, pp. 65, 75, and 89.

Suzuki et al, "A Photonic Wavelength–Division Switching System Using Tunable Laser Diode Filters", Journal of Lightwave Technology, vol. 4, No. 5, 1990, pp. 660–666.

Sugita et al, "Strictly Nonblocking 8 × 8 Integrated Optical Matrix Switch With Silica–Based Waveguides On Silicon Substrate" 16th European Conference on Optical Communication, 1990.

(List continued on next page.)

*Primary Examiner*—James W. Davie
*Attorney, Agent, or Firm*—Leydig, Voit & Mayer

[57] ABSTRACT

A semiconductor light emitting device includes a double heterojunction structure including an active layer, a cladding layer having a first conductivity type, and a cladding layer having a second conductivity type, which cladding layers sandwich the active layer, and an undoped cladding layer interposed between the first conductivity type cladding layer and the active layer, which undoped cladding layer is the same material as the first conductivity type cladding layer and has a thickness larger than the diffusion length of carriers in the undoped cladding layer. Therefore, carriers are accumulated in the undoped cladding layer and then regularly injected into the active layer by Coulomb repulsion between the carriers, resulting in a semiconductor light emitting device with reduced heat generation, reduced fluctuation of emitted laser light, and reduced noise.

12 Claims, 24 Drawing Sheets

OTHER PUBLICATIONS

Adachi, "Properties Of Aluminium Gallium Arsenide", Inspec, pp. 223 and 133 (No Date).

Numai, "1.5 µm Phase-Controlled Distributed Feedback Wavelength Tunable Optical Filter", IEEE Journal of Quantum Electronics, vol. 28, No. 6, 1992, pp. 1508–1512.

Numai, "1.5 µm Phase–Shift–Controlled Distributed Feedback Wavelength Tunable Optical Filter", IEEE Journal of Quantum Electronics, vol. 28, No. 6, pp. 1513–1519 (No Date).

Thijs et al, "Sub–mA Threshold Operation of λ=1.5 µm Strained InGaAs Multiple Quantum Well Lasers Grown On (311)B InP Substrates", Applied Physics Letters, vol. 60, No. 26, 1992 pp. 3217–3219.

Numai, "1.5 –µm Two–Section Fabry–Perot Wavelength Tunable Optical Filter", Journal of Lightwave Technology, vol. 10, No. 1, 1992, pp. 1590–1596.

21   24   22a   23

24   22a   23

22c  22b

SEMICONDUCTOR LIGHT EMITTING DEVICE, LASER AMPLIFIER, AND INTEGRATED LIGHT AMPLIFIER AND WAVELENGTH VARIABLE FILTER

FIELD OF THE INVENTION

The present invention relates to a semiconductor light emitting device, a laser amplifier, and an integrated light amplifier and variable wavelength filter employed in highly sensitive optical communication systems and optical switching systems.

BACKGROUND OF THE INVENTION

A low-noise semiconductor light emitting diode having the energy band structure shown in FIG. 27 is disclosed in the *Journal of Optical Society of America*, B, Volume 4, Number 10, October 1987, pages 1663–1666 (hereinafter referred to as JOSA). Although in this publication an AlGaAs light emitting diode is described, it is suggested that a similar structure is applicable to a laser diode. Therefore, an InP laser diode having the energy band structure shown in FIG. 27 is described. In FIG. 27, reference numeral 1 designates the band gap energy of an n type InP cladding layer, 2 the band gap energy of an InGaAsP active layer, 3 the band gap energy of a p type InP cladding layer, and 4a the band gap energy of an intrinsic (hereinafter referred to as i type) InP layer. The thickness L of the i type InP layer 4a is larger than the diffusion length Ln of electrons in the i type InP layer 4a, for example, L=2Ln.

Since the thickness of the i type InP layer 4a is larger than the diffusion length of the electrons in the i type InP layer 4a, electrons accumulate in that layer 4a and there is Coulomb repulsion between the accumulated electrons. As a result, the electrons are injected into the active layer 2 regularly, not at random.

Therefore, laser light is generated regularly. The square of the fluctuation of the number of photons $<\Delta n^2> = <n^2> - <n>^2$ is smaller than $<n>$, where n is the number of photons and $<>$ means the average, when electrons are injected into the active layer at random and coherent light is generated. Since the fluctuation in the number of photons is reduced, a low-noise laser diode is realized.

According to JOSA, the relationship between a current IL flowing in the i type InP layer 4a and a voltage VL applied to that layer 4a is $$IL = (9/8)(\epsilon \mu_n/L^3) A V L \quad (1)$$

wherein $\epsilon$ is the dielectric constant, $\mu_n$ is electron mobility in the i type InP layer 4a, and A is the area in which the current flows. A is equal to w (stripe width)×d (resonator length). When the laser light is connected to a photodetector through an optical fiber, a value F obtained by dividing the square of fluctuation of photon number by the average photocurrent is $$F = 1 + \eta L \cdot \eta C \cdot \eta D \ (8kT/VL-1) \quad (2)$$

where $\eta C$ is the coupling efficiency of the laser light to the optical fiber, $\eta D$ is the quantum efficiency of the photodetector, k is Boltzmann's constant, T is the absolute temperature, and $\eta L$ is the quantum efficiency of the laser diode. The quantum efficiency $\eta L$ of the laser diode is $$\eta L = \eta i \times \frac{(1-Rf)\sqrt{Rr}}{(1-Rf)\sqrt{Rr} + (1-Rr)\sqrt{Rf}} \times \frac{(1/2d)\ln(1/RfRr)}{\alpha in + (1/2d)\ln(1/RfRr)} \quad (3)$$

where ln is the natural logarithm, $\eta i$ is the internal quantum efficiency, $\alpha in$ is the internal loss, Rf is the reflectivity at the front facet of the resonator, and Rr is the reflectivity at the rear facet of the resonator.

According to *Applied Physics Letters*, Volume 60, pages 3217–3219 (1992) (hereinafter referred to as APL), an InGaAsP series laser diode with a threshold current of 1 mA is realized by employing a strained quantum well structure as an active layer. In this laser diode, the internal loss $\alpha in$ is 10 cm$^{-1}$. In InGaAsP, the internal quantum efficiency $\eta i$ is 0.8 as described in *IEEE Journal of Quantum Electronics*, Volume QE-24, pages 29–35 (1988). Assuming that Rf=1%, Rr=90%, $\eta C=0.65$, and $\eta D=0.90$, $\eta L \cdot \eta C \cdot \eta D$ becomes 0.32. In this case, the operating current at a light output of 5 mW is 11 mA.

In order to obtain an i type semiconductor in which the Fermi energy in the thermal equilibrium state is in the center of the band gap, InP for example, having a band gap energy of 1.35 eV is doped with Fe having an impurity level at a position of 0.65 eV from the conduction band edge. According to "Properties of Indium Phosphide" INSPEC (1990) (hereinafter referred to as INSPEC), the resistivity $\rho$ of InP doped with Fe is 2.1–4.6×10$^7$ $\Omega$cm. Fe produces acceptor levels. According to INSPEC, doping to 5×10$^{16}$/cm$^3$ gives an electron diffusion length (Ln) of 0.75 μm. Assuming that L=2Ln=1.5 μm, w=1.5 μm, and d=300 μm, the resistivity RL of the InP layer doped with Fe is 7×10$^8$ $\Omega$cm when $\rho$ is 2.1×10$^7$ $\Omega$cm. In this state, when a current of 11 mA flows, 7.7×10$^6$ V (VL) is applied to the InP layer, so that the value F of the equation (2) is 0.68, that is, smaller than the 0.899, of the light emitting diode described in JOSA in which an i type AlGaAs layer is interposed between an n type AlGaAs cladding layer and a GaAs active layer, a further reduction in noise is achieved.

However, an intrinsic semiconductor layer has a high resistivity. For example, in the prior art InP series laser diode described above, the power consumption of the Fe doped InP layer, i.e., the intrinsic semiconductor layer, is 84.7×10$^3$ W. Assuming that the thermal resistivity is 30° C./W, the temperature rise is as high as 2,540,000° C. Such a high temperature rise melts the crystal.

SUMMARY OF THE INVENTION

An object of the present invention is to provide a semiconductor light emitting device with reduced heat generation, reduced fluctuation of emitted light, and reduced noise.

Another object of the present invention is to provide a laser amplifier with reduced heat generation, reduced fluctuation, and reduced noise.

Still another object of the present invention is to provide an integrated light amplifier and variable wavelength filter with reduced heat generation, reduced fluctuation, and reduced noise.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a semiconductor light emitting device includes a double heterojunction structure in which an active layer is sandwiched between a first conductivity type cladding layer and a second conductivity type cladding layer, and the double heterojunction structure further includes an undoped layer disposed between the first conductivity type cladding layer and the active layer and comprising the same material as the first conductivity type cladding layer. The undoped cladding layer is thicker than the diffusion length of charge carriers in the undoped cladding layer. Therefore, charge carriers accumulate in the undoped cladding layer and are regularly injected into the active layer by Coulomb repulsion between the charge carriers, resulting in a semiconductor light emitting device with reduced heat generation, reduced fluctuation of emitted laser light, and reduced noise.

According to a second aspect of the present invention, in the semiconductor light emitting device, the first conductivity type cladding layer is a p type cladding layer, the second conductivity type cladding layer is an n type cladding layer, and the undoped cladding layer is thicker than the diffusion length of holes in that layer.

According to a third aspect of the present invention, in the semiconductor light emitting device, the first conductivity type cladding layer is a p type InP cladding layer, the second conductivity type cladding layer is an n type InP cladding layer, the active layer is an InGaAsP active layer, the undoped cladding layer is undoped InP, and the undoped InP cladding layer is thicker than the diffusion length of holes in that layer.

According to a fourth aspect of the present invention, in the semiconductor light emitting device, the first conductivity type cladding layer is an n type cladding layer, the second conductivity type cladding layer is a p type cladding layer, and the undoped cladding layer is thicker than the diffusion length of electrons in that layer.

According to a fifth aspect of the present invention, in the semiconductor light emitting device, the first conductivity type cladding layer is an n type $Al_xG_{1-x}As$ cladding layer, the second conductivity type cladding layer is a p type $Al_xGa_{1-x}As$ cladding layer, the active layer is an $Al_yGa_{1-y}As$ (x>y) active layer, the undoped cladding layer is $Al_xGa_{1-x}As$, and the undoped $Al_xGa_{1-x}As$ cladding layer is thicker than the diffusion length of electrons in that layer.

According to a sixth aspect of the present invention, in the semiconductor light emitting device, the first conductivity type cladding layer is an n type $Al_xGa_{1-x}As$ cladding layer, the second conductivity type cladding layer is a p type $Al_xGa_{1-x}As$ cladding layer, the active layer is an InGaAs/ $Al_yGa_{1-y}As$ (x>y) strained quantum well active layer, the undoped cladding layer is $Al_xGa_{1-x}As$, and the undoped $Al_xGa_{1-x}As$ cladding layer is thicker than the diffusion length of electrons in that layer.

According to a seventh aspect of the present invention, in the semiconductor light emitting device, the first conductivity type cladding layer is a p type cladding layer, the second conductivity type cladding layer is an n type cladding layer, and the undoped p type cladding layer is thicker than the diffusion length of holes in that layer.

According to an eighth aspect of the present invention, in the semiconductor light emitting device, the first conductivity type cladding layer is a p type $Al_xGa_{1-x}As$ cladding layer, the second conductivity type cladding layer is an n type $Al_xGa_{1-x}As$ cladding layer, the active layer is an $Al_yGa_{1-y}As$ (x>y) active layer, the undoped cladding layer is $Al_xGa_{1-x}As$, and the undoped $Al_xGa_{1-x}As$ cladding layer is thicker than the diffusion length of holes in that layer.

According to a ninth aspect of the present invention, in the semiconductor light emitting device, the first conductivity type cladding layer is a p type $Al_xGa_{1-x}As$ cladding layer, the second conductivity type cladding layer is an n type $Al_xGa_{1-x}As$ cladding layer, the active layer is an InGaAs/ $Al_yGa_{1-y}As$ (x>y) strained quantum well active layer, the undoped cladding layer is $Al_xGa_{1-x}As$, and the undoped $Al_xGa_{1-x}As$ cladding layer is thicker than the diffusion length of holes in that layer.

According to a tenth aspect of the present invention, a semiconductor light emitting device includes a double heterojunction structure in which an active layer is sandwiched between a first first conductivity type cladding layer and a second conductivity type cladding layer. The double heterojunction structure further includes a second first conductivity type cladding layer interposed between the first first conductivity type cladding layer and the active layer and a third first conductivity type cladding layer disposed within the first first conductivity type cladding layer at a position spaced apart from the second first conductivity type cladding layer by a distance longer than the diffusion length of charge carriers in the first first conductivity type cladding layer. The second first conductivity type cladding layer has an energy barrier that suppresses the flow of charge carriers with higher efficiency than the first first conductivity type cladding layer, and the third first conductivity type cladding layer has an energy barrier that suppresses the flow of charge carriers with lower efficiency than the second first conductivity type cladding layer and higher efficiency than the first first conductivity type cladding layer. Therefore, charge carriers accumulate in the first first conductivity type cladding layer between the second and third first conductivity type cladding layers and are injected into the active layer regularly by Coulomb repulsion between the charge carriers, resulting in a semiconductor light emitting device with reduced heat generation, reduced fluctuation of emitted light, and reduced noise.

According to an eleventh aspect of the present invention, in the semiconductor light emitting device, the second and third first conductivity type cladding layers have the same band gap energy, and the second first conductivity type cladding layer is thicker than the third first conductivity type cladding layer.

According to a twelfth aspect of the present invention, in the semiconductor light emitting device, the first first conductivity type cladding layer and the second conductivity type cladding layer comprise InP, and the second and third first conductivity type cladding layers comprise $Ga_xIn_{1-x}P$, and the active layer comprises InGaAsP.

According to a thirteenth aspect of the present invention, in the semiconductor light emitting device, the first first conductivity type cladding layer and the second conductivity type cladding layer comprise $Al_yGa_{1-y}As$, the second and third first conductivity type cladding layers comprise $Al_xGa_{1-x}As$ (x>y), and the active layer comprises AlGaAs.

According to a fourteenth aspect of the present invention, in the semiconductor light emitting device, the first first conductivity type cladding layer and the second second conductivity type cladding layer comprise $Al_yGa_{1-y}As$, the second and third first conductivity type cladding layers comprise $Al_xGa_{1-x}As$ (x>y), and the active layer comprises an InGaAs/AlGaAs strained quantum well structure.

According to a fifteenth aspect of the present invention, in the semiconductor light emitting device, the first first conductivity type cladding layer and the second conductivity type cladding layer comprise $(Al_xGa_{1-y})_{0.5}In_{0.5}P$, the second and third first conductivity type cladding layers comprise $(Al_xGa_{1-x})_{0.5}In_{0.5}P$ (x>y), and the active layer comprises AlGaInP.

According to a sixteenth aspect of the present invention, in the semiconductor light emitting device, the second and third first conductivity type cladding layers have the same thickness, and the second first conductivity type cladding layer has a band gap energy larger than that of the third first conductivity type cladding layer.

According to a seventeenth aspect of the present invention, in the semiconductor light emitting device the first first conductivity type cladding layer and the second conductivity type cladding layer comprise InP, the second first conductivity type cladding layer comprises $Ga_xIn_{1-x}P$, the third first conductivity type cladding layer comprises $Ga_yIn_{1-y}P$ (x>y), and the active layer comprises InGaAsP.

According to an eighteenth aspect of the present invention, a laser amplifier includes a double heterojunction structure in which an active layer is sandwiched between a first conductivity type cladding layer and a second conductivity type cladding layer wherein laser light injected into the active layer is amplified, low reflectivity coatings are disposed on opposite facets of the double heterojunction structure, and an undoped cladding layer is interposed between the first conductivity type cladding layer and the active layer, which undoped cladding layer comprises the same material as the first conductivity type cladding layer and is thicker than the diffusion length of charge carriers in that layer. Therefore, charge carriers accumulate in the undoped cladding layer and are regularly injected into the active layer by Coulomb repulsion between the charge carriers, resulting in a laser amplifier with reduced heat generation, reduced fluctuation of emitted light, and reduced noise.

According to a nineteenth aspect of the present invention, a laser amplifier includes a double heterojunction structure in which an active layer is sandwiched between a first first conductivity type cladding layer and a second conductivity type cladding layer wherein laser light injected into the active layer is amplified, low reflectivity coating layers are disposed on opposite facets of the double heterojunction structure, a second first conductivity type cladding layer is interposed between the first first conductivity type cladding layer and the active layer, and a third first conductivity type cladding layer is disposed within the first first conductivity type cladding layer at a position spaced apart from the second first conductivity type cladding layer by a distance longer than the diffusion length of charge carriers in that layer. The second first conductivity type cladding layer has an energy barrier that suppresses the flow of charge carriers with higher efficiency than the first first conductivity type cladding layer, and the third first conductivity type cladding layer has an energy barrier that suppresses the flow of charge carriers with lower efficiency than the second first conductivity type cladding layer and higher efficiency than the first first conductivity type cladding layer. Therefore, charge carriers accumulate in the first first conductivity type cladding layer between the second and third first conductivity type cladding layers and are regularly injected into the active layer by Coulomb repulsion between the charge carriers, resulting in a laser amplifier with reduced heat generation, reduced fluctuation of emitted light, and reduced noise.

According to a twentieth aspect of the present invention, an integrated light amplifier and variable wavelength filter comprises a first conductivity type substrate, a first conductivity type cladding layer disposed on the substrate, a first conductivity type guide layer disposed on the first conductivity type cladding layer, an active layer disposed on a part of the guide layer, an undoped cladding layer disposed on the active layer, which undoped cladding layer is thicker than the diffusion length of charge carriers in that layer, a first second conductivity type cladding layer disposed on the undoped cladding layer and comprising the same material as the undoped cladding layer, and a second second conductivity type cladding layer disposed on a part of the guide layer where the active layer is absent. The light amplifier comprises the first conductivity type cladding layer, the guide layer, the active layer, the undoped cladding layer, and the first second conductivity type cladding layer, and amplifies laser light injected into the guide layer. The variable wavelength filter comprises the first conductivity type cladding layer, the guide layer, and the second second conductivity type cladding layer and selects a component having a wavelength from the laser light injected into the guide layer. Therefore, charge carriers accumulate in the undoped cladding layer and are regularly injected into the active layer due to Coulomb repulsion between the charge carriers, resulting in an integrated light amplifier and variable wavelength filter with reduced heat generation, reduced fluctuation of emitted light, and reduced noise.

According to a twenty-first aspect of the present invention, an integrated light amplifier and variable wavelength filter includes a first conductivity type substrate, a first conductivity type cladding layer disposed on the substrate, a first conductivity type guide layer disposed on the first conductivity type cladding layer, and active layer disposed on a part of the guide layer, a first second conductivity type cladding layer disposed on the active layer, a second second conductivity type cladding layer disposed on a part of the guide layer where the active layer is absent, a third second conductivity type cladding layer interposed between the first second conductivity type cladding layer and the active layer, and a fourth second conductivity type cladding layer disposed within the first second conductivity type cladding layer at a position spaced apart from the third second conductivity type cladding layer by a distance longer than the diffusion length of charge carriers in that layer. The third second conductivity type cladding layer has an energy barrier that suppresses the flow of charge carriers with higher efficiency than the first second conductivity type cladding layer, and the fourth second conductivity type cladding layer has an energy barrier that suppresses the flow of charge carriers with lower efficiency than the third second conductivity type cladding layer and higher efficiency than the first second conductivity type cladding layer. The light amplifier comprises the first conductivity type cladding layer, the guide layer, the active layer, and the first, third, and fourth second conductivity type cladding layers and amplifies laser light injected into the guide layer. The variable wavelength filter comprises the first conductivity type cladding layer, the guide layer, and the second second conductivity type cladding layer and selects a wavelength component from the laser light injected into the guide layer. Therefore, charge carriers are injected into the first second conductivity type cladding layer between the third and fourth second conductivity type cladding layers and the regularly injected into the active layer due to Coulomb repulsion between the charge carriers, resulting in an integrated light amplifier and variable wavelength filter with reduced heat generation, reduced fluctuation of emitted light, and reduced noise.

DETAILED DESCRIPTION OF THE PREFERRED EMBODIMENTS

Embodiment 1

Figure 1:
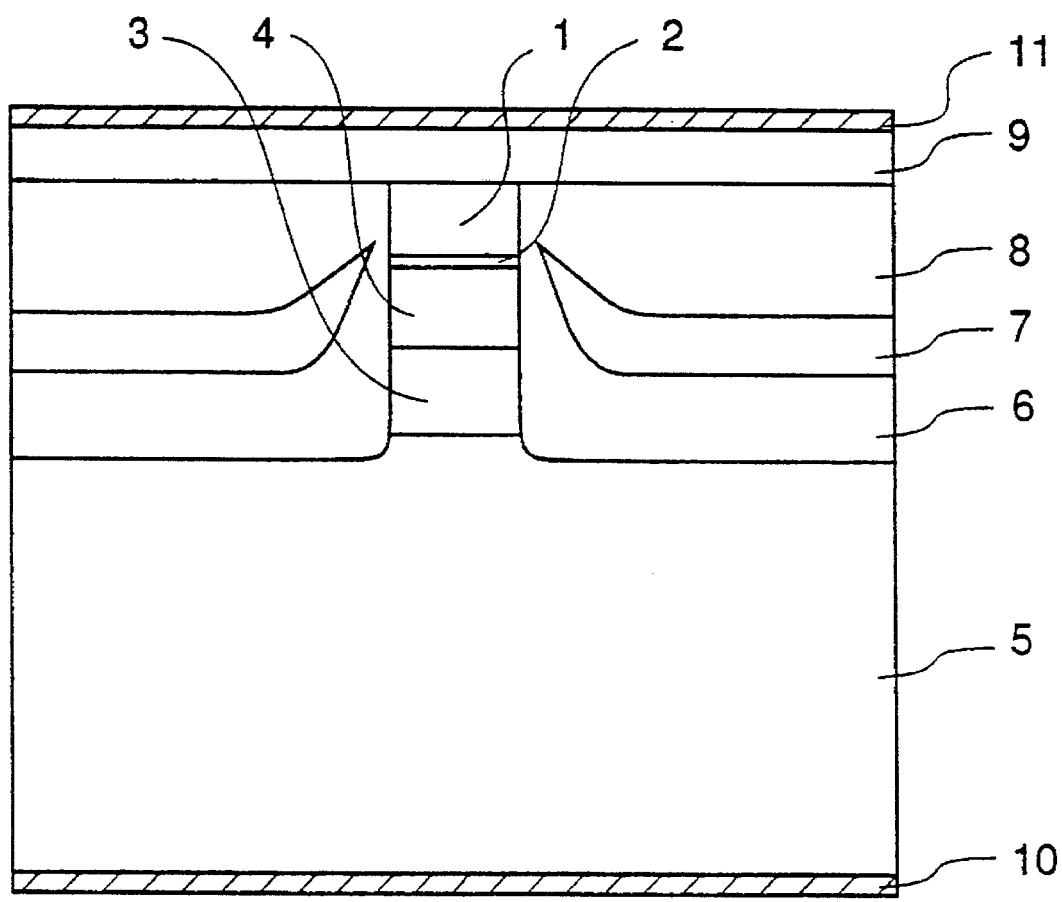
FIG. 1 is a sectional view illustrating a laser diode in accordance with a first embodiment of the present invention.

FIG. 1 is a sectional view illustrating a laser diode according to the first embodiment of the present invention. In this first embodiment of the invention, in an InGaAsP series laser diode including a double heterojunction structure comprising an n type InP cladding layer, an active layer, and a p type InP cladding layer, an undoped n type InP cladding layer is interposed between the p type InP cladding layer and the active layer. The undoped n type cladding layer has a thickness larger than the diffusion length Lp of holes in that layer.

More specifically, in FIG. 1, reference numeral 5 designates a p type InP substrate having a dopant concentration of $3 \times 10^{16}/cm^3$ and a thickness of 90 μm. A p type InP cladding layer having a dopant concentration of $1 \times 10^{18}/cm^3$ and a thickness of 1.5 μm is disposed on a central part of the p type InP substrate 5. An undoped InP layer 4 is disposed on the p type InP cladding layer 3. Although the InP layer 4 is undoped, it is n type because it contains Si as a residual impurity of the growth process. The concentration of Si is $10^{16}/cm^3$. The thickness of the undoped InP layer 4 is larger than the diffusion length Lp of holes in the layer 4. Since the hole diffusion length Lp in undoped InP is 1.8 μm as described APL, the thickness L of the undoped InP layer 4 is set to 3.6 μm (=2Lp) in this first embodiment. An undoped InGaAsP active layer 2 having a thickness of 0.1 μm is disposed on the undoped InP layer 4. An n type InP cladding layer 1 having a dopant concentration of $1\times10^{18}/cm^3$ and a thickness of 1.5 μm is disposed on the active layer 2. The p type InP cladding layer 3, the undoped InP layer 4, the undoped InGaAsP active layer 2, and the n type InP cladding layer 1 are included in a mesa structure having a width of 1.5 μm. P type InP mesa embedding layers 6 having a dopant concentration of $1\times10^{18}/cm^3$ are disposed on the p type InP substrate 5, contacting opposite sides of the mesa structure. N type InP current blocking layers 7 having a dopant concentration of $1\times10^{18}/cm^3$ are disposed on the mesa embedding layers 6. P type InP current blocking layers 8 having a dopant concentration of $1\times10^{18}/cm^3$ are disposed on the n type InP current blocking layers 7. An n type InGaAsP contact layer 9 having a dopant concentration of $3\times10^{18}/cm^3$ and a thickness of 0.5 μm is disposed on the n type InP cladding layer 1 and on the p type InP current blocking layers 8. A p side electrode 10 comprising AuZn series material is disposed on the rear surface of the p type InP substrate 5, and an n side electrode 11 comprising AuGe series material is disposed on the n type contact layer 9.

FIGS. 2(a)–2(d) are sectional views illustrating process steps in a method of fabricating the laser diode shown in FIG. 1. In these figures, the same reference numerals as in FIG. 1 designate the same or corresponding parts. Reference numeral 12 designates an $SiO_2$ film. FIG. 3 is a schematic diagram illustrating the energy band structure in the vicinity of the active layer of the laser diode shown in FIG. 1.

Figure 2:
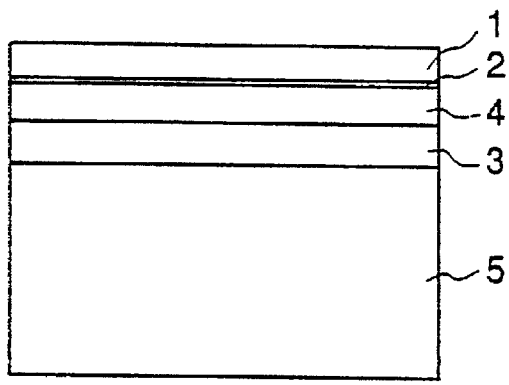
FIGS. 2(a)-2(d) are sectional views illustrating process steps in a method of fabricating the laser diode of FIG. 1.
Figure 2:
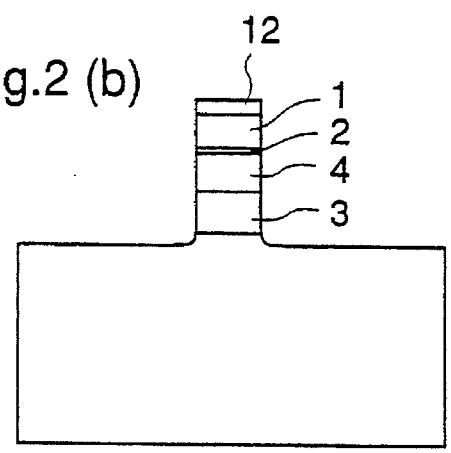
Figure 2:
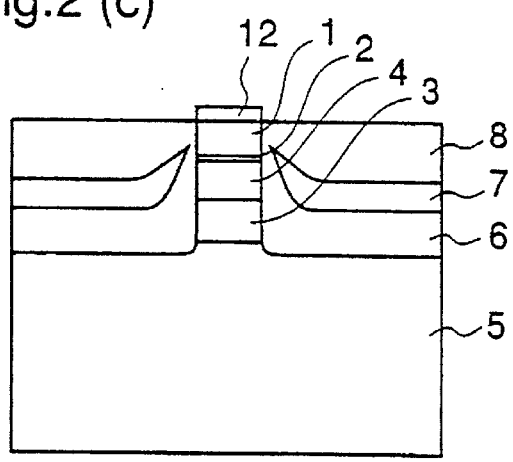
Figure 2:
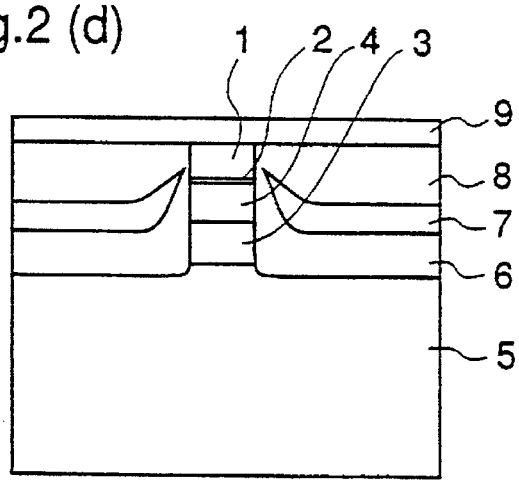
Figure 3:
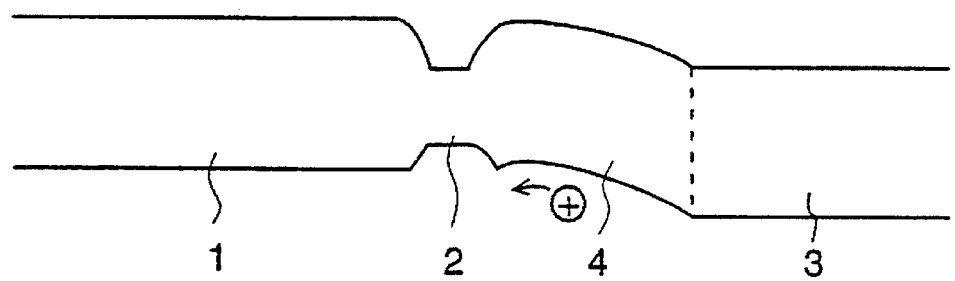
FIG. 3 is a schematic diagram illustrating an energy band structure in a region adjacent to an active layer of a laser diode according to the first embodiment of the invention.

Initially, as illustrated in FIG. 2(a), there are successively grown on the p type InP substrate 1 the p type cladding layer 3, the undoped layer 4, the active layer 2, and the n type cladding layer 1, preferably by MOCVD (Metal Organic Chemical Vapor Deposition).

Thereafter, an $SiO_2$ film 12 is deposited on the n type cladding layer 1 by CVD (Chemical Vapor Deposition) and patterned in a stripe shape. Using the stripe-shaped $SiO_2$ film 12 as a mask, the structure is wet-etched from the n type cladding layer 1 until the etching front reaches the p type InP substrate 1 to form a stripe-shaped mesa (FIG. 2(b)).

In the step of FIG. 2(c), the p type mesa embedding layer 6, the n type current blocking layer 7, and the p type current blocking layer 8 are successively grown on the substrate 5 by MOCVD, contacting opposite sides of the mesa structure. After removal of the $SiO_2$ film 12, the n type InGaAsP contact layer 9 is grown by MOCVD. To complete the laser diode, the p side electrode 10 and the n side electrode 11 are produced by metallizing.

In the semiconductor laser diode according to the first embodiment of the invention, since the undoped layer 4 has a low impurity concentration and a thickness larger than the hole diffusion length, the n type undoped layer 4 becomes a space-charge-limited current region. In this region, holes accumulate and, because of Coulomb repulsion, the accumulated holes are regularly injected into the active layer 2, not at random. As the result, laser light is generated regularly and the fluctuation in the number of photons is reduced, thereby realizing a low-noise laser diode. Since the resistivity of undoped InP is 0.55 Ωcm, when the resistance RL of the undoped InP layer 4 is 44Ω and the operating current is 11 mA, the voltage VL applied to the undoped InP layer 4 is 0.48 V. When these values are applied to equation (2), F, i.e., the value obtained by dividing the square of the fluctuation of the number of photons by the average photocurrent, is 0.82 which is larger than 0.68 in the case of Fe-doped InP but smaller than 0.899 described in JOSA. Noise is reduced in the laser diode according to the first embodiment of the invention. Further, the voltage applied to the entire structure of the laser diode is 3.1 V, that is, the total of 1.3 V applied to the heterojunction, 1.35 V applied across the p type InP cladding layer 3 and the undoped InP layer 4, and 0.44 V applied to the undoped InP layer 4. Assuming that the current is 11 mA, the power consumption is 0.034 W, and the temperature rise when the thermal resistance of the laser diode is 30° C./W is only 1° C., a temperature rise that does not affect the laser oscillation.

According to the first embodiment of the invention, in the InGaAsP series laser diode including the double heterojunction structure comprising the n type InP cladding layer, the active layer, and the p type InP cladding layer, the undoped InP layer having a thickness larger than the hole diffusion length Lp in that layer is interposed between the p type InP cladding layer and the active layer. Therefore, a laser diode with reduced heat generation and reduced noise is realized.

Although in the foregoing description the undoped layer 4 is disposed between the p type cladding layer 3 and the active layer 2, it may be disposed between the n type cladding layer 1 and the active layer 2. A laser diode with reduced fluctuation of emitted laser light and reduced noise is achieved. In this case, however, since the electron diffusion length Ln in the undoped InP layer is 24–28 μm as described in JOSA, the thickness of the undoped InP layer is about 50 μm. Such a thick undoped InP layer is not practical.

Embodiment 2

Figure 4:
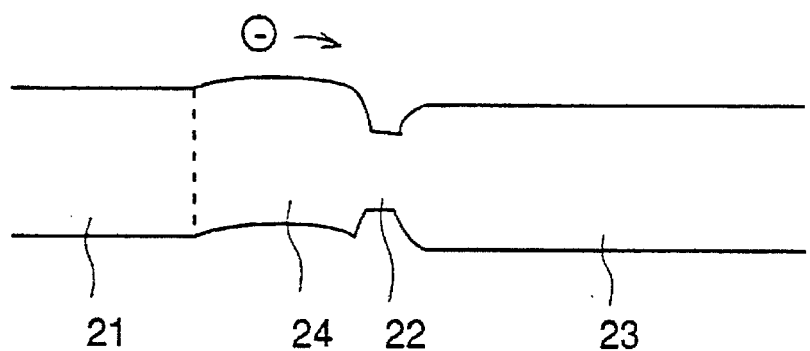
FIG. 4 is a schematic diagram illustrating an energy band structure in a region adjacent to an active layer of a laser diode according to a second embodiment of the invention.

FIG. 4 is a schematic diagram illustrating an energy band structure of a laser diode according to a second embodiment of the invention. In this second embodiment of the invention, a laser diode having a structure similar to the first embodiment comprises AlGaAs series material; that is, in a laser diode including a double heterojunction structure comprising an n type AlGaAs cladding layer, an active layer, and a p type AlGaAs cladding layer, an undoped AlGaAs cladding layer having a thickness larger than the electron diffusion length in that layer is interposed between the n type AlGaAs cladding layer and the active layer.

More specifically, in FIG. 4, reference numeral 21 designates an n type $3\times10^{18}/cm^3$ $Al_xGa_{1-x}As$ cladding layer, numeral 22 designates an $Al_yGa_{1-y}As$ active layer (x>y), numeral 23 designates a p type $Al_xGa_{1-x}As$ cladding layer, and numeral 24 designates an undoped $Al_xGa_{1-x}As$ cladding layer. Although the layer 24 is undoped, it is p type because it contains a residual impurity, i.e., carbon, in a concentration of $1\times10^{17}/cm^3$. According to "Properties of Aluminium Gallium Arsenide" INSPEC (1993), the electron diffusion length Ln in undoped $Al_xGa_{1-x}As$ is 2.3 μm. Therefore, the thickness L of the undoped $Al_xGa_{1-x}As$ cladding layer 24 must be larger than the electron diffusion length Ln. In this second embodiment, the thickness L is 4.6 μm (=2Ln). In this laser diode, assuming that the values of αin, Rf, Rr, and ηC are the same as those of the InGaAsP series laser diode of the first embodiment and ηD is 0.72, ηL.ηC.ηD is 0.29. When the threshold current is 20 mA, the operating current at 5 mW light output is 25 mA.

In the prior art AlGaAs series laser diode suggested in JOSA, when oxygen is present as a dopant in a region of the n type AlGaAs cladding layer adjacent to the active layer, this region becomes an intrinsic semiconductor region, and it is thought that the fluctuation of laser light and noise can be reduced. In this laser diode, however, since an oxygen doping concentration of about $10^{17}/cm^3$ results in a resistivity of $10^4$ Ωcm, the temperature rises by 1000° C., which melts the crystal.

On the other hand, in this second embodiment of the invention, since the undoped layer 24 has a low impurity concentration and a thickness larger than the electron diffusion length in that layer, electrons accumulate in the undoped layer 24 and are separated by Coulomb repulsion. Therefore, electrons are injected into the active layer 22 regularly, not at random. As the result, laser light is generated regularly and the fluctuation in the number of photons is reduced, thereby realizing a low-noise laser diode. Assuming that the undoped $Al_xGa_{1-x}As$ layer 24 has a resistivity of 0.6 Ωcm, a stripe width w of 2.5 μm, and a resonator length d of 300 μm, the resistance RL of the undoped layer 24 is 37Ω and the voltage VL applied to that layer is 0.92 V. When these values are applied to equation (2), F is 0.78, which means that this laser diode has reduced noise.

Further, the voltage applied to the entire structure of the laser diode is 4.8 V, that is, a total of 1.85 V is applied to the heterojunction, 2.0 V is applied across the n type $Al_xGa_{1-x}As$ cladding layer 21 and the undoped $Al_xGa_{1-x}As$ cladding layer 24, and 0.92 V is applied to the undoped $Al_xGa_{1-x}As$ cladding layer, and the power consumption is 0.12 W. Assuming that the thermal resistivity is 30° C./W, the temperature rise is only 3.6° C. and hardly affects the laser oscillation. As a result, a laser diode with reduced heat generation and reduced noise is realized.

Embodiment 3

Figure 5:
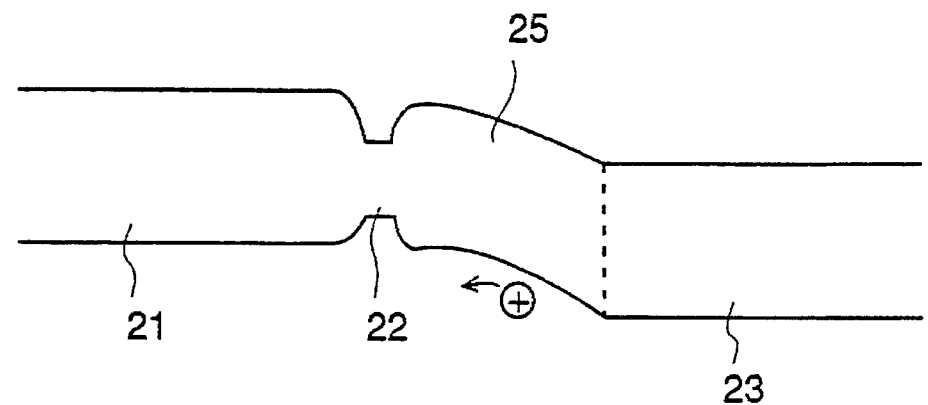
FIG. 5 is a schematic diagram illustrating an energy band structure in a region adjacent to an active layer of a laser diode according to a third embodiment of the invention.

FIG. 5 is a schematic diagram illustrating an energy band structure in a region adjacent to an active layer of a laser diode according to a third embodiment of the present invention. In the figure, the same reference numerals as in FIG. 4 designate the same or corresponding parts. Reference numeral 25 designates an undoped $Al_xGa_{1-x}As$ cladding layer. While in the second embodiment the p type undoped $Al_xGa_{1-x}As$ cladding layer 24 is interposed between the n type cladding layer 21 and the active layer 22, in this third embodiment an undoped $Al_xGa_{1-x}As$ layer 25 having a thickness larger than the hole diffusion length in that layer 25 is interposed between the active layer 22 and the p type cladding layer 23.

According to *Physics of Semiconductor Devices* by S. M. Sze, 1st edition, page 38 (formula (39)) and page 44 (formula (44b)), the hole diffusion length Lp is $$Lp = \sqrt{(\tau Dp)} = \sqrt{(\tau - \text{const})} \ m_h^{-5/4}$$

where Dp is the diffusion constant of a hole, τ is the lifetime of a hole, and $m_h$ is the effective mass of a hole. Generally, in compound semiconductors, the effective mass of a hole is about one order of magnitude larger than the effective mass of an electron. Therefore, the hole diffusion length in p type semiconductors is one order of magnitude shorter than the electron diffusion length in n type semiconductors. In undoped AlGaAs, the hole diffusion length Lp is shorter than several microns. Therefore, when the undoped $Al_xGa_{1-x}As$ layer 25 is thicker than the hole diffusion length Lp, the undoped $Al_xGa_{1-x}As$ layer 25 becomes a space-charge-limited current region, and holes flow into the active layer 22 not at random, but regularly, resulting in a low-noise AlGaAs series laser diode.

In this third embodiment of the invention, in addition to the same effects as described in the second embodiment, the thickness of the undoped layer can be reduced compared to that of the second embodiment.

Embodiment 4

Figure 6:
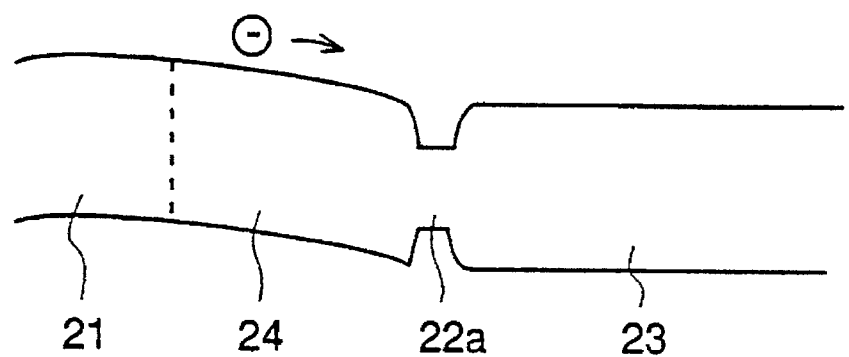
FIGS. 6(a) and 6(b) are schematic diagrams illustrating an energy band structure in a region adjacent to an active layer of a laser diode according to a fourth embodiment of the invention.
Figure 6:
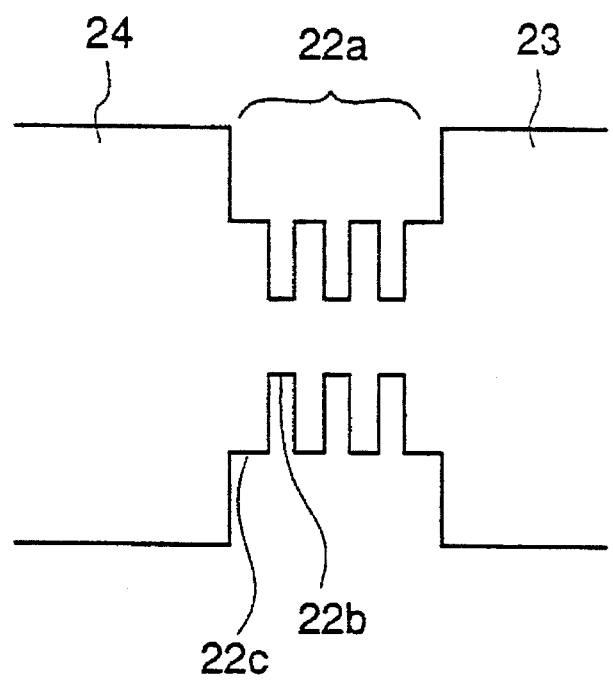

FIGS. 6(a) and 6(b) are schematic diagrams for explaining an energy band structure of a laser diode in accordance with a fourth embodiment of the invention, in which FIG. 6(a) shows the energy band structure in a region adjacent to an active layer, and FIG. 6(b) is an enlarged view of a part of FIG. 6(a). In these figures, the same reference numerals as in FIG. 4 designate the same or corresponding parts. The laser structure according to this fourth embodiment is fundamentally identical to the laser structure according to the second embodiment except that a multiquantum well (hereinafter referred to as MQW) active layer 22a is interposed between the undoped p type $Al_xGa_{1-x}As$ cladding layer 24 and the p type $Al_xGa_{1-x}As$ cladding layer 23. The MQW active layer 22a comprises three alternating InGaAs well layers 22b and four $Al_yGa_{1-y}As$ barrier layers 22c (x>y), whereby a 0.98 μm band laser diode is achieved.

In this fourth embodiment, the undoped $Al_xGa_{1-x}As$ cladding layer 24 is p type because of residual impurities from the growth process, and the thickness is larger than the electron diffusion length in that layer 24. Therefore, the undoped $Al_xGa_{1-x}As$ layer 24 becomes a space-charge-limited current region, resulting in a 0.98 μm band laser diode with reduced noise and reduced heat generation.

Embodiment 5

Figure 7:
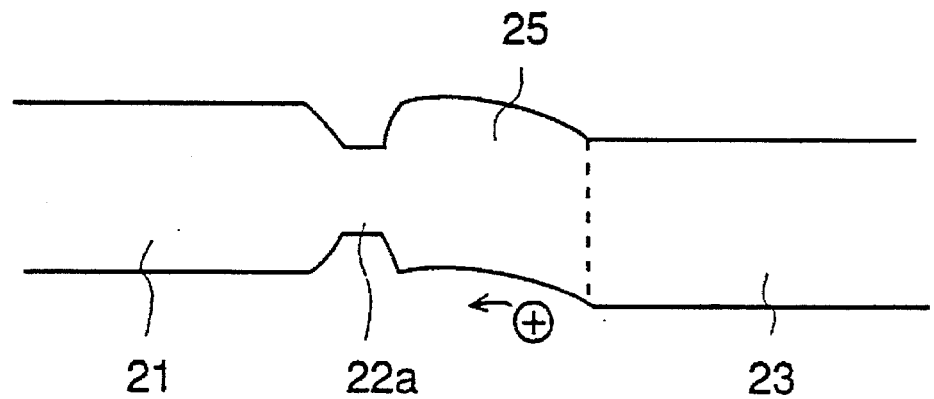
FIGS. 7(a) and 7(b) are schematic diagrams illustrating an energy band structure in a region adjacent to an active layer of a laser diode according to a fifth embodiment of the invention.
Figure 7:
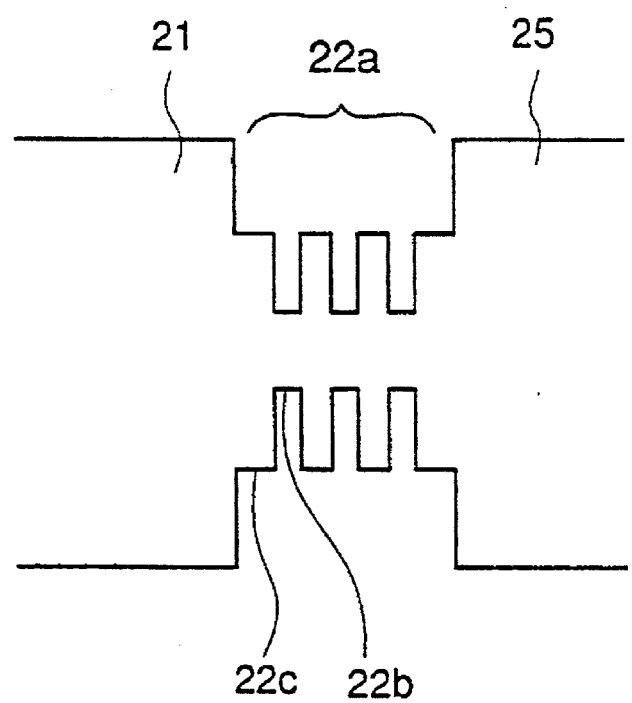

FIGS. 7(a) and 7(b) are schematic diagrams for explaining an energy band structure of a laser diode in accordance with a fifth embodiment of the invention, in which FIG. 7(a) shows the energy band structure in a region adjacent to an active layer, and FIG. 7(b) is an enlarged view of a part of FIG. 7(a). In these figures, the same reference numerals as in FIGS. 5, 6(a), and 6(b) designate the same or corresponding parts. The laser structure according to this fifth embodiment is fundamentally identical to the laser structure according to the third embodiment except that a multiquantum well (hereinafter referred to as MQW) active layer 22a is interposed between the undoped $Al_xGa_{1-x}As$ cladding layer 25 and the n type $Al_xGa_{1-x}As$ cladding layer 21. The MQW active layer 22a comprises three alternating InGaAs well layers 22b and four $Al_yGa_{1-y}As$ barrier layers 22c (x>y), whereby a 0.98 μpm band laser diode is realized.

In this fifth embodiment, the undoped $Al_xGa_{1-x}As$ cladding layer 25 is p type because of residual impurities from the growth process, and the thickness is larger than the hole diffusion length in that layer 25. Therefore, the undoped $Al_xGa_{1-x}As$ layer 25 becomes a space-charge-limited current region, resulting in a 0.98 μm band laser diode with reduced noise and reduced heat generation.

While the first to fifth embodiments include InP series laser diodes and AlGaAs series laser diodes, the present invention may be applied to laser diodes of other materials, light emitting diodes other than laser diodes, laser amplifiers, and semiconductor light emitting devices, such as a variable wavelength filter with a light amplifier.

Japanese Published Patent Application Hei. 3-88382 discloses an AlGaInP semiconductor laser in which an undoped $(Al_xGa_{1-x})_{0.5}In_{0.5}P$ (0≦x≦1) layer is disposed in a region between an $(Al_xGa_{1-x})_{0.5}In_{0.5}P$ (0≦x≦1) active layer and a p type $(Al_yGa_{1-y})_{0.5}In_{0.5}P$ cladding layer (0≦y≦1) except a region adjacent to a laser light emitting facet, and Zn is diffused into the active layer in the region adjacent to the laser light emitting facet. In this semiconductor laser, however, the thickness of the undoped $(Al_xGa_{1-x})_{0.5}In_{0.5}P$ (0≦x≦1) layer is 0.1 μm, and this is shorter than the hole diffusion length in that layer. Therefore, noise is not reduced in this prior art laser.

Embodiment 6

Figure 8:
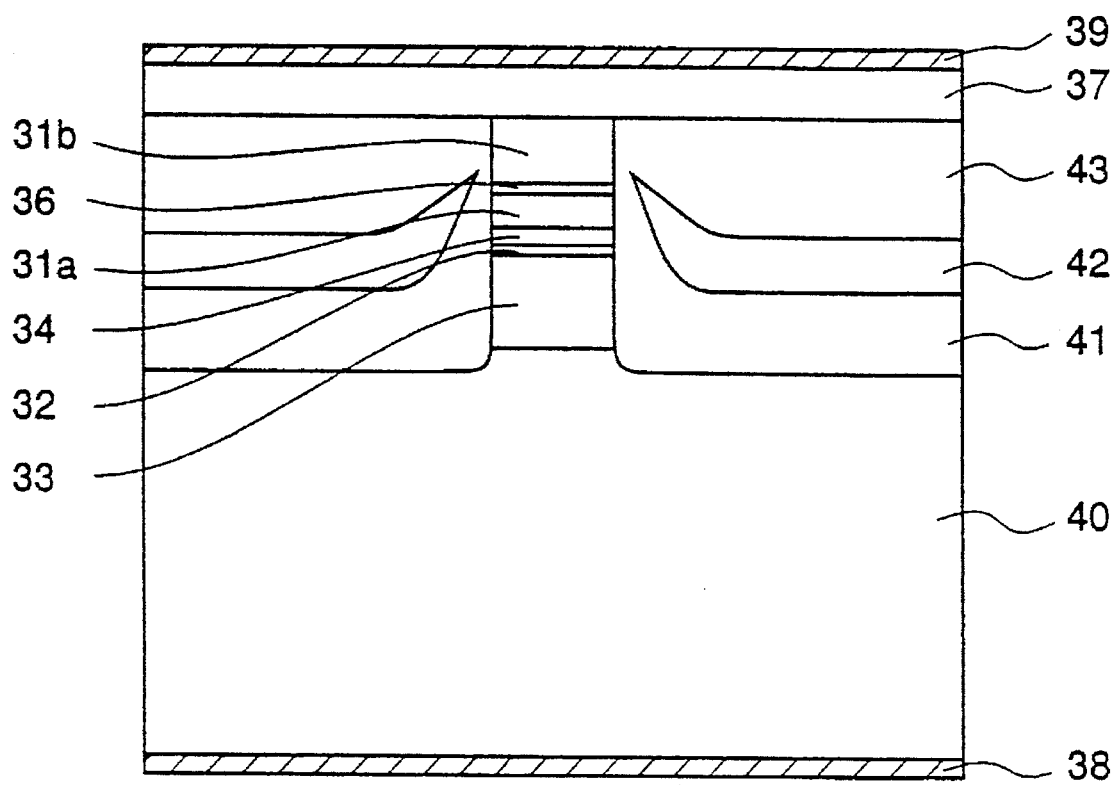
FIG. 8 is a sectional view illustrating a laser diode in accordance with a sixth embodiment of the invention.

FIG. 8 is a sectional view illustrating a laser diode in accordance with a sixth embodiment of the present invention. In this sixth embodiment, a laser diode has a double heterojunction structure comprising a first n type cladding layer, an active layer, and a p type cladding layer. A second n type cladding layer having a thickness t1 and a band gap energy larger than the band gap energy of the first n type cladding layer is interposed between the first n type cladding layer and the active layer. Further, a third n type cladding layer having a thickness t2 (t2<t1) and a band gap energy equivalent to that of the second cladding layer is inserted within the first n type cladding layer at a position spaced from the second n type cladding layer by a distance longer than the electron diffusion length in the first n type cladding layer.

More specifically, in FIG. 8, reference numeral 40 designates a p type InP substrate having a thickness of 90 μm and a dopant concentration of $3 \times 10^{18}/cm^3$. A p type InP cladding layer 33 having a thickness of 1.5 μm and a dopant concentration of $1 \times 10^{18}/cm^3$ is disposed on a center part of the substrate 40. An undoped InGaAsP active layer 32 having a thickness of 0.1 μm is disposed on the p type InP cladding layer. A second n type cladding layer 34 comprising $Ga_xIn_{1-x}As$ is disposed on the active layer 32. The second cladding layer 34 has a thickness t1 of 150 Å and a dopant concentration of $1 \times 10^{18}/cm^3$. First n type cladding layers 31a and 31b comprising InP are disposed on the second n type cladding layer 34. Each of these first cladding layers 31a and 31b has a thickness of 1.5 μm and a dopant concentration of $1 \times 10^{18}/cm^3$. A third n type cladding layer 36 comprising $Ga_xIn_{1-x}As$ is interposed between the first n type cladding layers 31a and 31b. The third cladding layer 36 has a thickness t2 of 100 Å and a dopant concentration of $1 \times 10^{18}/cm^3$. The p type InP cladding layer 33, the undoped InGaAsP active layer 32, the second n type $Ga_xIn_{1-x}As$ cladding layer 34, the first n type InP cladding layers 31a and 31b, and the third n type $Ga_xIn_{1-x}As$ cladding layer 36 are included in a stripe-shaped mesa structure having a width of 1.5 μm. P type InP mesa embedding layers 41 having a dopant concentration of $1 \times 10^{18}/cm^3$ are disposed on the p type InP substrate 40 contacting opposite sides of the mesa structure. N type InP current blocking layers 42 having a dopant concentration of $1 \times 10^{18}/cm^3$ are disposed on the p type InP mesa embedding layers 41. P type InP current blocking layers 43 having a dopant concentration of $1 \times 10^{18}/cm^3$ are disposed on the n type InP current blocking layers 42. An InGaAsP contact layer 37 having a thickness of 0.5 μm and a dopant concentration of $3 \times 10^{18}/cm^3$ is disposed on the first n type InP cladding layer 31b and on the p type InP current blocking layers 43. An n side electrode 39 is disposed on the contact layer 37, and a p side electrode 38 is disposed on the rear surface of the substrate 40. The fabrication process of this laser structure is fundamentally identical to the process described with respect to FIGS. 2(a)–2(d).

FIGS. 9(a) and 9(b) show an energy band structure in the vicinity of the active layer 32 of the laser structure shown in FIG. 8. In the figures, the same reference numerals as in FIG. 8 designate the same or corresponding parts. Reference numeral 16 designates an electron flow across the second and third cladding layers 34 and 36, and numeral 17 designates electrons accumulated when current flows across the second and third cladding layers 34 and 36. The electrons 17 provide a space-charge-limited current region.

In the laser diode according to the sixth embodiment of the invention, the second n type $Ga_xIn_{1-x}P$ cladding layer 34 having a thickness t1 and a band gap energy larger than that of the n type InP cladding layer 31a is disposed between the n type InP cladding layer 31a and the active layer 32, and the third n type $Ga_xIn_{1-x}P$ cladding layer 36 having a thickness t2 (t2<t1) and the same composition as the second cladding layer 34 is disposed between the n type InP cladding layers 31a and 31b. In this structure, the distance between the second n type cladding layer 34 and the third n type cladding layer 36 is longer than the electron diffusion length in the first n type cladding layer 31a. Further, the thicknesses t1 and t2 of the second and third cladding layers 34 and 36 are appropriately set so that electrons can pass through the second and third cladding layers 34 and 36 by tunneling. When the Ga composition ratio x of the third n type $Ga_xIn_{1-x}P$ cladding layer 36 is 0.2 and the thickness t2 is 100 Å, electrons in the n type InP cladding layer 31b pass through the second n type cladding layer 36 by tunneling and reach the n type InP cladding layer 31a. When the Ga composition ratio x of the second n type $Ga_xIn_{1-x}P$ cladding layer 34 is 0.2 and the thickness t1 is larger than t2, for example, 150 Å, the electrons reaching the n type InP cladding layer 31a pass through the second n type cladding layer 34 by tunneling and reach the active layer 32. However, since the thickness t1 of the second n type cladding layer 34 is larger than the thickness t2 of the third n type cladding layer 36, it is harder for the electrons to pass through the second n type cladding layer 34 than through the third n type cladding layer 36. Therefore, the electrons 17 are evenly accumulated between the third n type cladding layer 36 and the second n type cladding layer 34 (FIG. 9(b)). Coulomb repulsion between the accumulated electrons makes the n type InP cladding layer 31a a space-charge-limited current region. Therefore, the electrons are injected into the active layer 32 not at random, but regularly. Since laser light is generated due to the regularly injected electrons, the fluctuation of the laser light is reduced, resulting in a low-noise InGaAsP series laser diode.

According to the sixth embodiment of the invention, the second n type cladding layer having a thickness t1 and a band gap energy larger than that of the first n type cladding layer is interposed between the first n type cladding layer and the active layer and, furthermore, the third n type cladding layer having a thickness t2 (t2<t1) and a band gap energy equivalent to that of the second cladding layer is inserted within the first n type cladding layer at a position spaced from the second n type cladding layer by a distance longer than the electron diffusion length in the first n type cladding layer. Therefore, a laser diode with reduced heat generation and reduced noise is realized.

Figure 35:
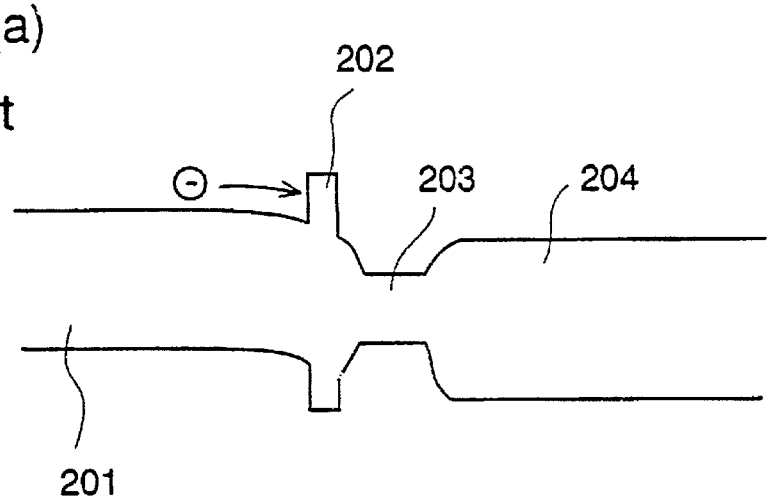
FIGS. 35(a), 35(b), 35(c) are schematic diagrams illustrating an energy band structure in a region adjacent to an active layer of a laser diode according to the prior art.
Figure 35:
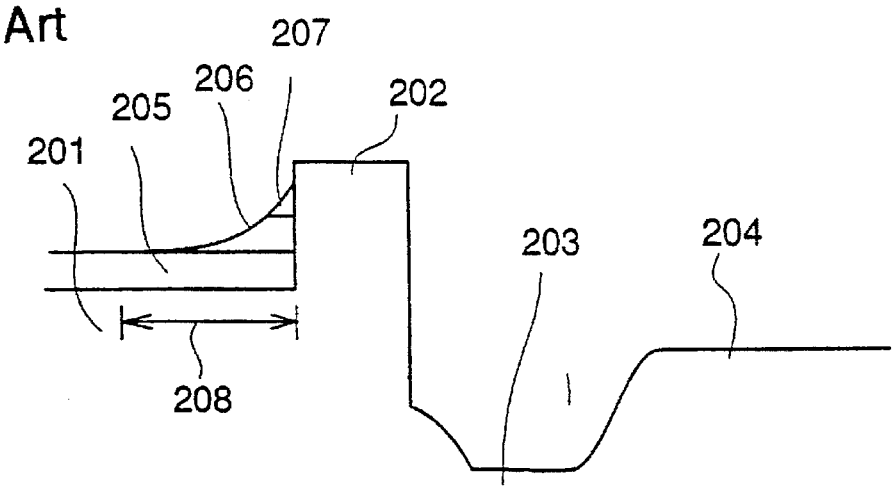
Figure 35:
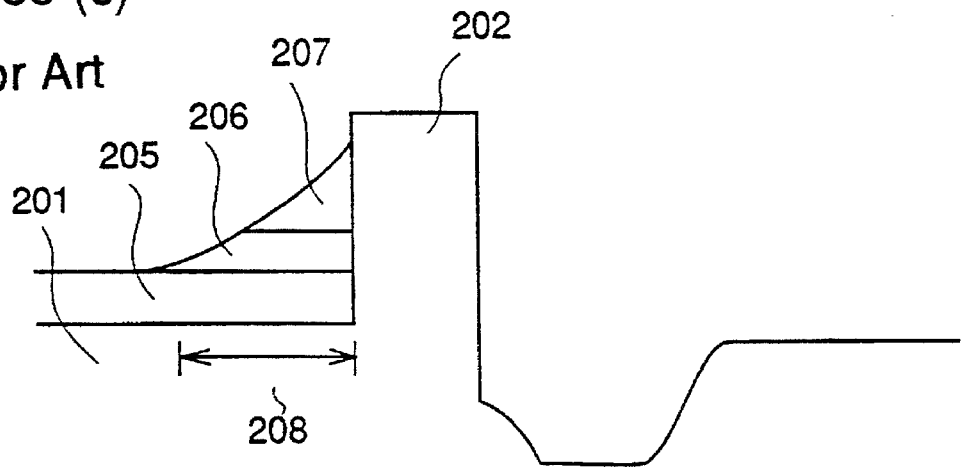

Japanese Published Patent Application Sho. 61-181185 discloses a semiconductor light emitting device in which a semiconductor layer having a band gap energy larger than that of a cladding layer is interposed between an active layer and the cladding layer. FIG. 35 shows an energy band structure of an InGaAsP series laser diode as an example of the semiconductor light emitting device. In FIG. 35, reference numeral 201 designates an n type InP cladding layer, 202 is an n type InGaP layer, 203 is an InGaAsP active layer, 204 is a p type InP cladding layer, 205 designates electrons stored in the n type InP cladding layer 201 when current does not flow, 206 designates electrons forming a space-charge-limited current region when current flows, 207 designates electrons excessively accumulating when current flows, and 208 designates the diffusion length of electrons in the n type InP cladding layer 201. When current flows through the structure as shown in FIG. 35(a), electrons accumulate, forming a sloped energy band edge, in a region at the boundary between the n type InP cladding layer 201 and the n type InGaAsP layer 202. Since the electrons 206 form a space-charge-limited current region, the electrons are regularly injected into the active layer 203 as in the sixth embodiment of the invention, and a laser diode with reduced noise is realized. However, when the height of the energy barrier of the n type InGaAsP layer 202 is not sufficient, the length of the space-charge-limited current region 206 is shorter than the electron diffusion length 208 in the n type InP cladding layer 201, whereby some of the electrons are unfavorably injected into the active layer 203 at random, an obstacle to reducing noise of the laser diode. When the height of the energy barrier of the n type InGaAsP layer 202 is controlled to make the space-charge-limited current region 206 longer than the electron diffusion length 208 in the n type InP cladding layer 201, the excessive accumulation of electrons 207 increases as shown in FIG. 35(c). Therefore, excessive current has to flow in the laser diode, and the excessive current causes heat generation that adversely affects the performance of the device.

In the sixth embodiment of the invention, however, since the electrons 17 are evenly accumulated as shown in FIG. 9(b), a space-charge-limited current region longer than the electron diffusion length is produced without accumulating excess electrons. As a result, the degree of freedom in designing the laser diode is increased.

Embodiment 7

Figure 9:
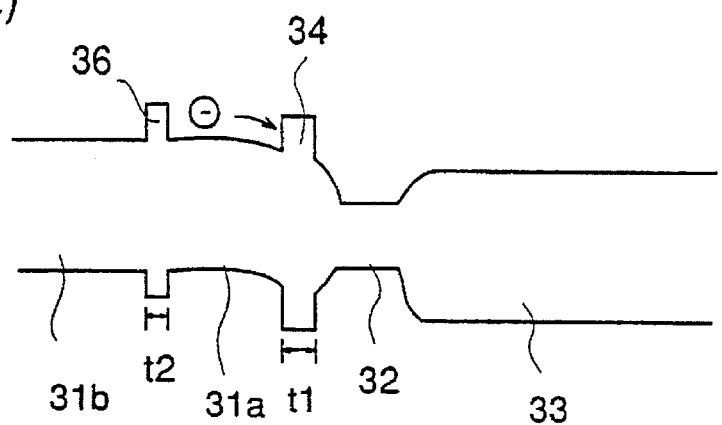
FIGS. 9(a) and 9(b) are schematic diagrams illustrating an energy band structure in a region adjacent to an active layer of a laser diode according to the sixth embodiment of the invention.
Figure 9:
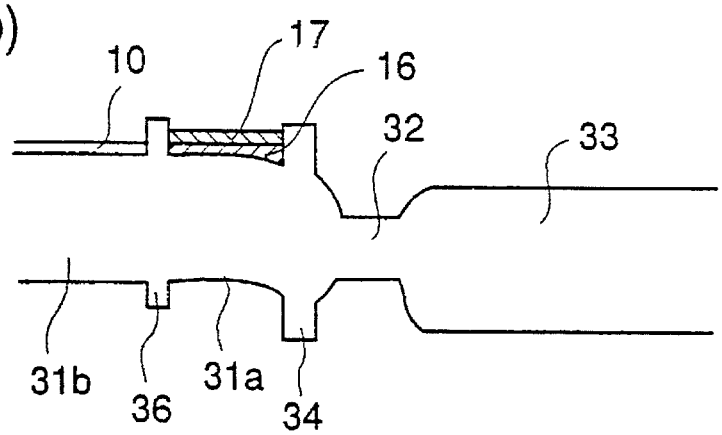
Figure 10:
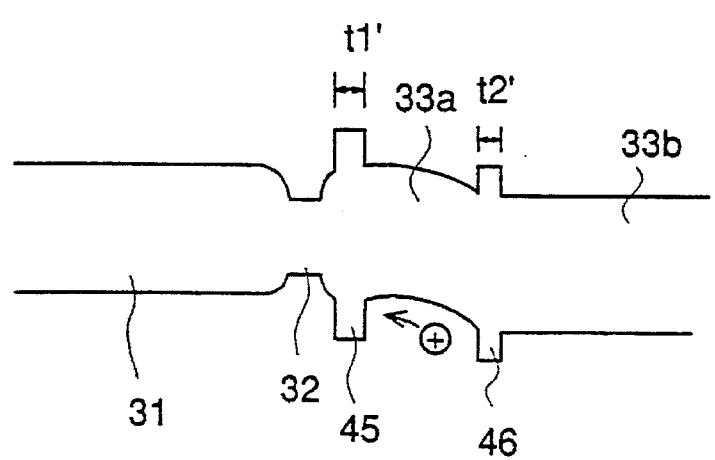
FIG. 10 is a schematic diagram illustrating an energy band structure in a region adjacent to an active layer of a laser diode according to a seventh embodiment of the invention.

FIG. 10 is a schematic diagram illustrating an energy band structure of a laser diode in accordance with a seventh embodiment of the present invention. In the figure, the same reference numerals as in FIG. 9 designate the same or corresponding parts. Reference numeral 31 designates an n type InP cladding layer. An InGaAsP active layer 32 is disposed on the n type InP cladding layer 31. A second p type $Ga_xIn_{1-x}P$ cladding layer 45 is disposed on the active layer 32. The second p type cladding layer 45 has a thickness t1' and a band gap energy larger than that of the first p type cladding layer 33a. A third p type $Ga_xIn_{1-x}P$ cladding layer 46 is interposed between the first p type cladding layers 33a and 33b. The third p type cladding layer 46 has a thickness t2' thinner than the thickness t1' of the second p type cladding layer 45 and a band gap energy larger than that of the first p type InP cladding layers 33a and 33b. The thicknesses t1' and t2' of the second and third cladding layers 45 and 46 are set so that holes can pass through the second and third cladding layers 45 and 46 by tunneling. Since it is harder for holes than electrons to pass through a barrier, the thicknesses t1' and t2' of the second and third cladding layers 45 and 46 are thinner than the thicknesses t1 and t2 of the second and third cladding layers 34 and 36 of the sixth embodiment. The thickness of the first cladding layer 33a disposed between the second and third cladding layers 45 and 46 is about 1.5 µm, which is larger than the hole diffusion length in the first cladding layer 33a.

In this structure, when the thickness t2' of the third cladding layer 46 is as thin as 10 Å, holes in the first p type cladding layer 33b pass through the barrier of the third cladding layer 46 by tunneling and reach the first p type cladding layer 33a. When the thickness t1' of the second cladding layer 45 is thicker than the thickness t2' of the third cladding layer 46, for example, 15 Å, the holes stored in the first p type cladding layer 33a pass through the second cladding layer 45 due to tunneling and reach the active layer 32. However, since the second cladding layer 45 is thicker than the third cladding layer 46, it is harder for holes to pass through the second cladding layer 45 than through the third cladding layer 46. Therefore, holes accumulate in a region between the third cladding layer 46 and the second cladding layer 45, and Coulomb repulsion between the accumulated holes produces current flowing through the first cladding layer 33a as a space-charge-limited current. Therefore, the holes are injected into the active layer 32 regularly, not at random. Since laser light is produced by the regularly injected holes, the fluctuation of the laser light is reduced, resulting in a low-noise InGaAsP series laser diode.

While in the sixth and seventh embodiments the second and third cladding layers comprise $Ga_xIn_{1-x}P$, these layers may comprise other materials as long as the material has a band gap energy larger than the band gap energy of the first InP cladding layer. For example, $Al_xIn_{1-x}P$ having a band gap energy larger than the band gap energies of other InP based compound semiconductors is employed for the second and third cladding layers and the thicknesses of these layers are appropriately selected so that electrons or holes can pass through these layers. Also in this case, the same effects as described above are achieved.

Embodiment 8

Figure 11:
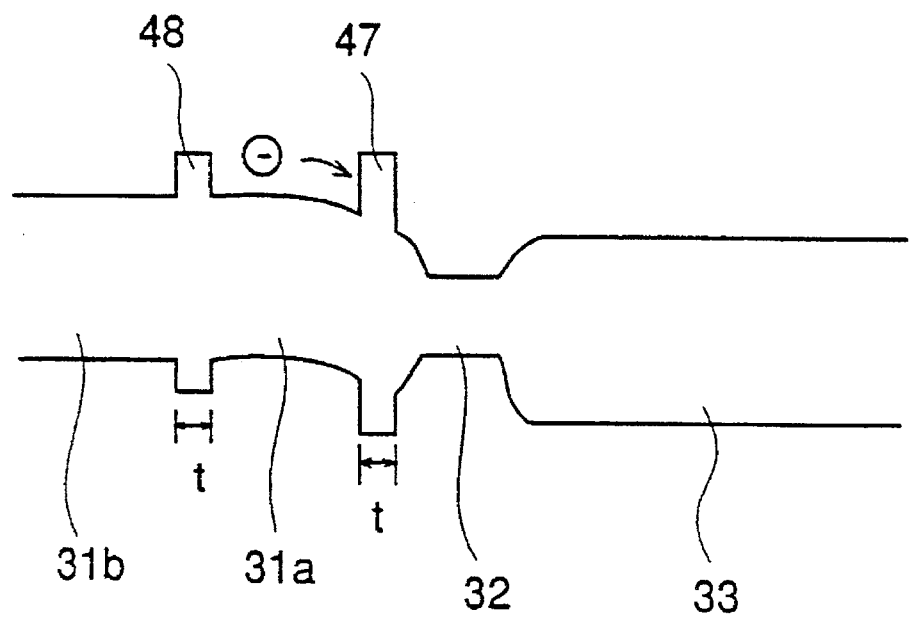
FIG. 11 is a schematic diagram illustrating an energy band structure in a region adjacent to an active layer of a laser diode according to an eighth embodiment of the invention.

FIG. 11 is a schematic diagram illustrating an energy band structure for explaining a laser diode in accordance with an eighth embodiment of the invention. In this eighth embodiment, in a laser diode including a double heterojunction structure comprising a first n type cladding layer, an active layer, and a p type active layer, a second n type cladding layer having a band gap energy larger than that of the first n type cladding layer and a thickness t is interposed between the first n type cladding layer and the active layer and, furthermore, a third n type cladding layer having a band gap energy larger than that of the first n type cladding layer and smaller than that of the second n type cladding layer and having a thickness t is inserted within the first n type cladding layer. The distance between the second n type cladding layer and the third n type cladding layer is longer than the electron diffusion length in the first n type cladding layer.

In FIG. 11, the same reference numerals as in FIG. 9 designate the same or corresponding parts. Reference numeral 47 designates a second n type $Ga_xIn_{1-x}P$ cladding layer having a band gap energy larger than that of the first n type InP cladding layers 31a and 31b and a thickness t of 100 Å, and numeral 48 designates a third n type $Ga_yIn_{1-y}P$ (x>y) cladding layer having a band gap energy larger than that of the first n type InP cladding layers 31a and 31b and smaller than that of the second n type $Ga_xIn_{1-x}P$ cladding layer 47 and a thickness t of 100 Å. The thickness of the first cladding layer 31a interposed between the second and third cladding layers 47 and 48 is 1.5 µm, thicker than the electron diffusion length in the first cladding layer 31a. The thickness t of the second and third cladding layers 47 and 48 is set so that electrons can path through the second and third cladding layers 47 and 48.

In this eighth embodiment, when the thickness t of the second and third cladding layers 47 and 48 is 100 Å, electrons in the first cladding layer 31b pass through the third cladding layer 48 by tunneling and reach the first cladding layer 31a. These electrons reaching the first cladding layer 31a pass through the 100 Å thick second cladding layer 47 by tunneling and reach the active layer 32. Since the band gap energy of the second cladding layer 47 is larger than the band gap energy of the third cladding layer 48, it is harder for the electrons to pass through the second cladding layer 47 than through the third cladding layer 48. Therefore, the electrons accumulate in the first cladding layer 31a and Coulomb repulsion between the accumulated electrons produces a current flowing through the first cladding layer 31a as a space-charge-limited current, resulting in a low-noise InGaAsP series laser diode.

Embodiment 9

Figure 12:
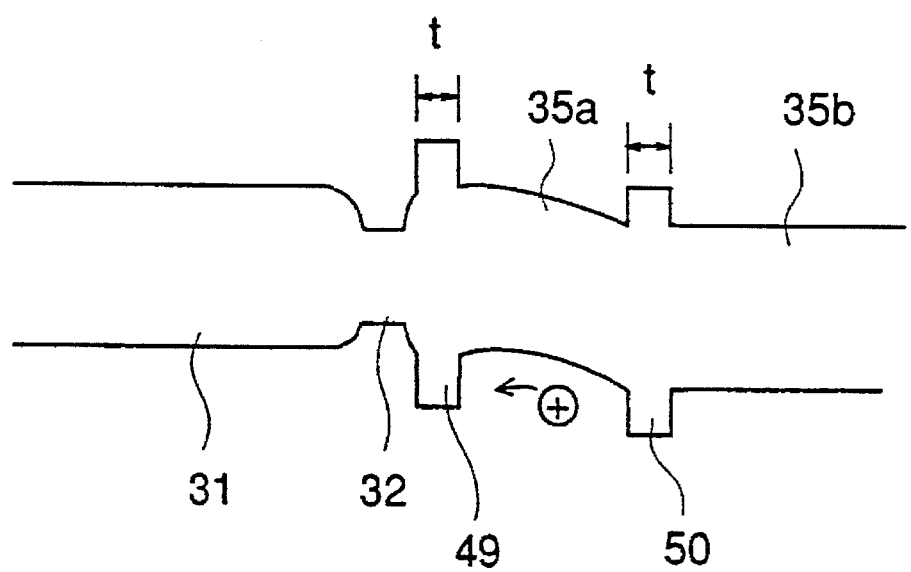
FIG. 12 is a schematic diagram illustrating an energy band structure in a region adjacent to an active layer of a laser diode according to a ninth embodiment of the invention.

FIG. 12 is an energy band diagram for explaining a laser diode in accordance with a ninth embodiment of the present invention. In FIG. 12, the same reference numerals as in FIG. 11 designate the same or corresponding parts. Reference numeral 31 designates an n type InP cladding layer, and numerals 35a and 35b designate first p type InP cladding layers. A second p type $Ga_xIn_{1-x}P$ cladding layer 49 having a band gap energy larger than that of the first p type cladding layers 35a and 35b and a thickness t of 10 Å is interposed between the active layer 32 and the first p type cladding layer 35a. A third p type $Ga_yIn_{1-y}P$ (x>y) cladding layer 50 having a band gap energy larger than that of the first p type cladding layers 35a and 35b and smaller than that of the second p type cladding layer 49 and a thickness t of 10 Å is interposed between the first p type InP cladding layers 35a and 35b. The thickness t is selected so that holes can pass through the second and third cladding layers 49 and 50. The thickness of the first cladding layer 35a between the second and third cladding layers 49 and 50 is 1.5 μm, thicker than the hole diffusion length in the first cladding layer 35a.

In this laser structure, since the band gap energy of the second cladding layer 49 is larger than the band gap energy of the third cladding layer 50, it is harder for holes to pass through the second cladding layer 49 than through the third cladding layer 50. Therefore, the holes accumulate in the first cladding layer 35a and Coulomb repulsion between the accumulated holes produces a current flowing through the first cladding layer 35a as a space-charge-limited current, resulting in a low noise InGaAsP series laser diode.

While in the eighth and ninth embodiments of the invention the second and third cladding layers comprise $Ga_xIn_{1-x}P$ and $Ga_yIn_{1-y}P$ (x>y), respectively, these layers may comprise other materials as long as the band gap energies of these layers are larger than the band gap energy of the first cladding layer comprising InP. For example, $Al_xIn_{1-x}P$ and $Al_yIn_{1-y}P$ may be employed as the second and third cladding layers, respectively. Also in this case, the same effects as described in the eighth and ninth embodiments are achieved by controlling the thickness t of the second and third cladding layers.

Embodiment 10

Figure 13:
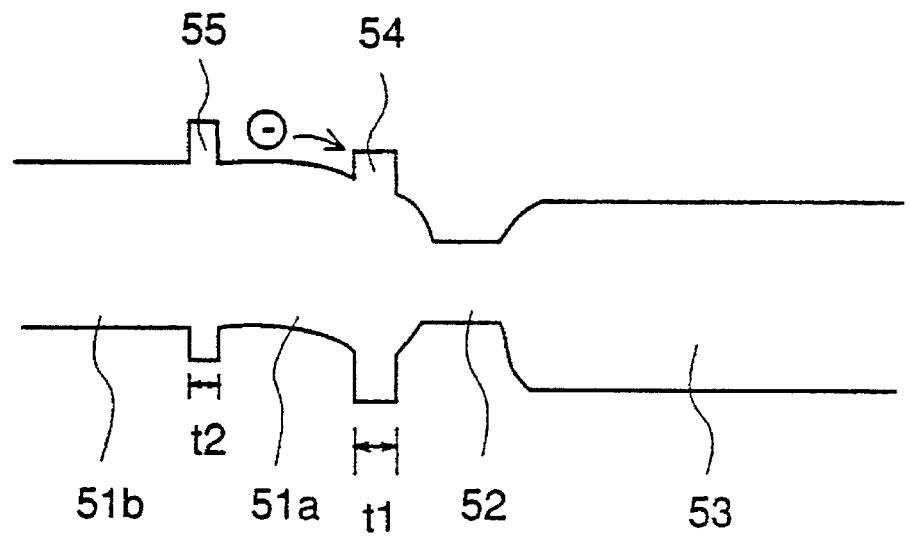
FIG. 13 is a schematic diagram illustrating an energy band structure in a region adjacent to an active layer of a laser diode according to a tenth embodiment of the invention.

FIG. 13 is an energy band diagram for explaining a laser diode in accordance with a tenth embodiment of the invention. In the figure, reference numerals 51a and 51b designate first n type $Al_yGa_{1-y}As$ cladding layers, numeral 52 designates an AlGaAs active layer having a composition that produces a band gap energy smaller than the band gap energy of the first n type $Al_yGa_{1-y}As$ cladding layers 51a and 51b, and numeral 53 designates a p type $Al_yGa_{1-y}As$ cladding layer. A second n type $Al_xGa_{1-x}As$ (x>y) cladding layer 54 having a band gap energy larger than that of the first n type $Al_yGa_{1-y}As$ cladding layer 51a and a thickness t1 of 150 Å is interposed between the first n type cladding layer 51a and the active layer 52. A third n type $Al_xGa_{1-x}As$ cladding layer 55 having a thickness t2 of 100 Å is interposed between the first n type $Al_yGa_{1-y}As$ cladding layers 51a and 51b. The thickness t2 is thinner than the thickness t1.

The structure of the laser diode according to this tenth embodiment is fundamentally identical to the structure according to the sixth embodiment except that the laser diode comprises AlGaAs series material, i.e., the first cladding layer comprises n type $Al_yGa_{1-y}As$ and the second and third cladding layers comprise n type $Al_xGa_{1-x}As$ (x>y).

Also in this case, the same effects as described in the sixth embodiment are achieved.

Likewise, in the seventh to ninth embodiments of the invention, the laser diode may comprise AlGaAs series materials in place of InP series materials. More specifically, according to a modification of the seventh embodiment of the invention, a laser diode includes a double heterojunction structure comprising an n type AlGaAs cladding layer, an active layer, and a first p type AlGaAs cladding layer. A second p type AlGaAs cladding layer having a band gap energy larger than that of the first p type AlGaAs cladding layer and a thickness t1 is interposed between the active layer and the first p type AlGaAs cladding layer. A third p type AlGaAs cladding layer having the same composition as the second cladding layer and a thickness t2 (t2<t1) is disposed within the first p type cladding layer.

Further, according to a modification of the eighth embodiment of the invention, a laser diode includes a double heterojunction structure comprising a first n type AlGaAs cladding layer, an active layer, and a p type AlGaAs cladding layer. A second n type AlGaAs cladding layer having a band gap energy larger than that of the first n type AlGaAs cladding layer and a thickness t is interposed between the first n type cladding layer and the active layer. A third n type AlGaAs cladding layer having a band gap energy larger than that of the first n type cladding layer and smaller than that of the second cladding layer and a thickness t is disposed within the first n type cladding layer.

Further, according to a modification of the ninth embodiment of the invention, a laser diode includes a double heterojunction structure comprising an n type AlGaAs cladding layer, an active layer, and a first p type AlGaAs cladding layer. A second p type AlGaAs layer having a band gap energy larger than that of the first p type cladding layer and a thickness t is interposed between the active layer and the first p type cladding layer. A third p type AlGaAs cladding layer having a band gap energy larger than that of the first p type cladding layer and smaller than that of the second p type cladding layer and a thickness t is disposed within the first p type cladding layer.

Embodiment 11

Figure 14:
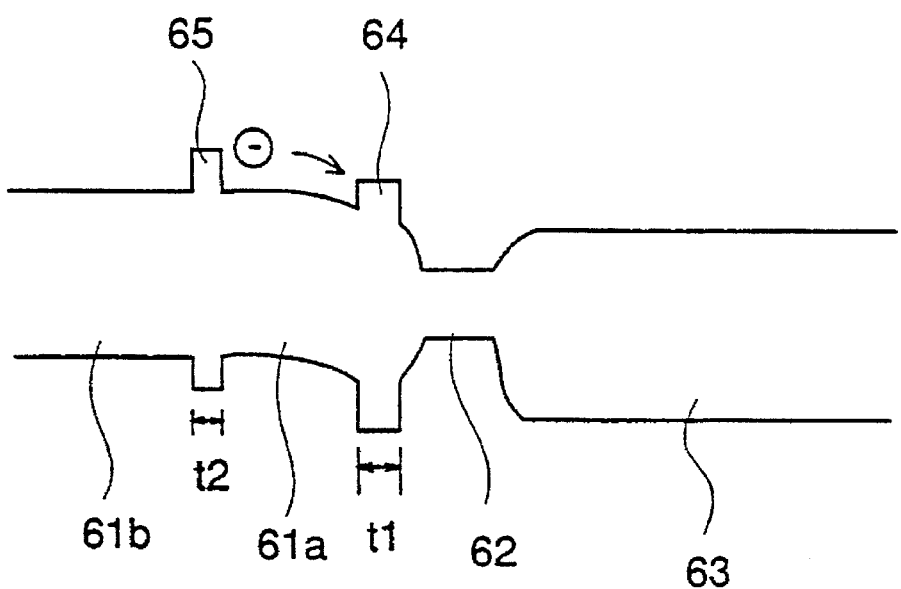
FIG. 14 is a schematic diagram illustrating an energy band structure in a region adjacent to an active layer of a laser diode according to an eleventh embodiment of the invention.

FIG. 14 is an energy band diagram for explaining a laser diode in accordance with an eleventh embodiment of the present invention. In the figure, reference numerals 61a and 61b designate first n type $(Al_yGa_{1-y})_{0.5}In_{0.5}P$ cladding layers, numeral 62 designates an AlGaInP active layer having a composition that produces a band gap energy smaller than that of the first n type cladding layers 61a and 61b, and numeral 63 designates a p type $(Al_yGa_{1-y})_{0.5}In_{0.5}P$ cladding layer. A second n type $(Al_xGa_{1-x})_{0.5}In_{0.5}P$ (x>y) cladding layer 64 having a band gap energy larger than that of the first n type cladding layer and a thickness t1 of 150 Å is interposed between the first n type cladding layer 61a and the active layer 62. A third n type $(Al_xGa_{1-x})_{0.5}In_{0.5}P$ cladding layer 65 having a thickness t2 (t2<t1), for example, 100 Å, is interposed between the first n type cladding layers 61a and 61b.

The structure of the laser diode according to this eleventh embodiment is fundamentally identical to the structure according to the sixth embodiment except that the laser diode comprises AlGaInP series materials, i.e., the first cladding layer comprises n type $(Al_yGa_{1-y})_{0.5}In_{0.5}P$ and the second and third cladding layers comprise n type $(Al_xGa_{1-x})_{0.5}In_{0.5}P$ (x>y). The same effects as described in the sixth embodiment are achieved.

Likewise, in the seventh to ninth embodiments of the invention, the laser diode may comprise AlGaInP series materials in place of InGaAsP series materials.

Embodiment 12

Figure 15:
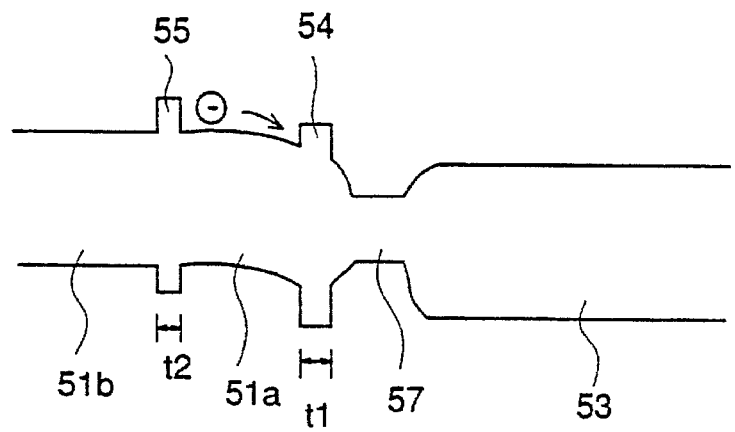
FIGS. 15(a) and 15(b) are schematic diagrams illustrating an energy band structure in a region adjacent to an active layer of a laser diode according to a twelfth embodiment of the invention.
Figure 15:
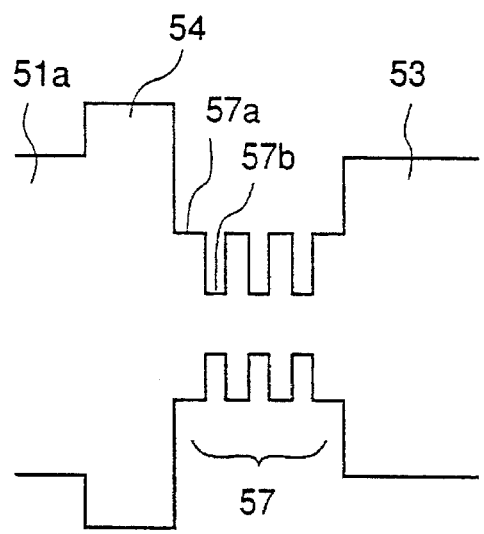

FIG. 15(a) is a schematic diagram illustrating an energy band structure in the vicinity of an active layer of a laser diode according to a twelfth embodiment of the invention, and FIG. 15(b) is an enlarged view of the energy band structure of the active layer. In these figures, the same reference numerals as in FIG. 13 designate the same or corresponding parts. Reference numeral 57 designates a strained quantum well active layer comprising alternating AlGaAs barrier layers 57a and InGaAs well layers 57b. Each well layer 57b is sandwiched between two barrier layers 57a.

The laser structure according to this twelfth embodiment is identical to the structure according to the tenth embodiment except that the active layer has a strained quantum well structure to produce a 0.98 μm band laser diode. The same effects as described in the tenth embodiment are achieved.

The laser diodes according to the sixth to ninth and eleventh embodiments may include strained quantum well active layers as in this twelfth embodiment of the invention.

Although in the sixth to twelfth embodiments emphasis has been placed upon a laser diode including a bulk active layer or a strained quantum well active layer, a similar structure including a strained multiquantum well active layer, a multiquantum well active layer, a quantum well active layer, a quantum wire active layer, a strained quantum wire active layer, a quantum box active layer, or a strained quantum box active layer is also within the scope of the present invention.

Although in the sixth to twelfth embodiments emphasis has been placed upon InGaAsP series laser diodes, AlGaAs series laser diodes, and AlGaInP series laser diodes, similar laser diodes comprising II-VI, III-V, or IV-IV compound semiconductors or other semiconductor materials are also within the scope of the present invention.

While in the first to twelfth embodiments of the invention laser diodes are described, the present invention may be applied to other light emitting diodes, laser amplifiers, and variable wavelength filters with light amplifiers.

While in the sixth to twelfth embodiments either the thickness or the band gap energy of the second cladding layer is different from that of the third cladding layer, the second and third cladding layers may have different thicknesses and different band gap energies. The band gap energies are selected so that the third cladding layer has an energy barrier that suppresses the flow of charge carriers with higher efficiency than the first cladding layer, and the second cladding layer has an energy barrier that suppresses the flow of charge carriers with higher efficiency than the third cladding layer, whereby electrons accumulate between the second cladding layer and the third cladding layer. The same effects as described above are achieved.

Embodiment 13

Figure 16:
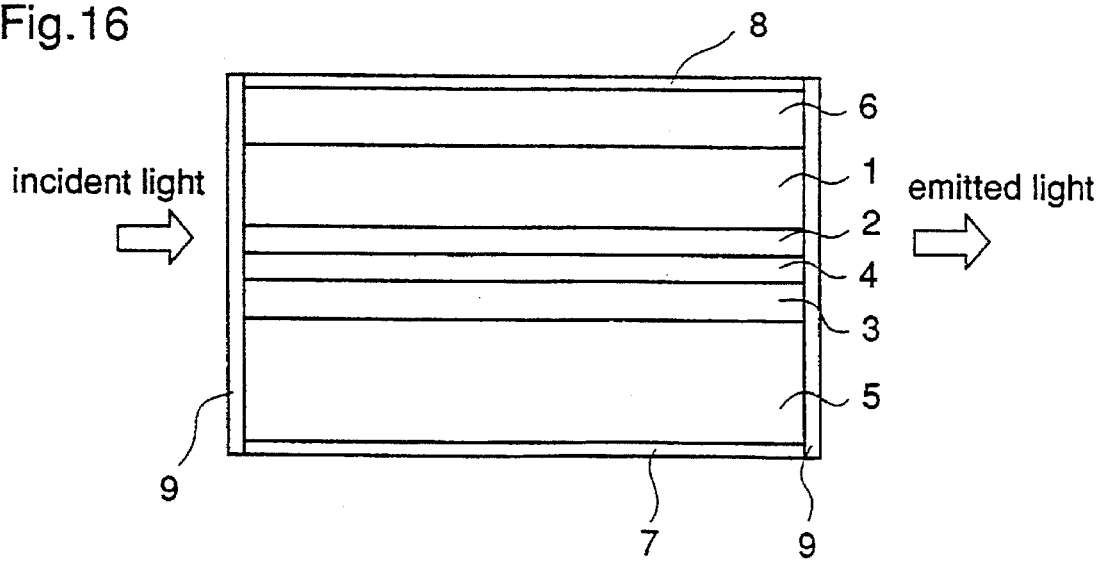
FIG. 16 is a sectional view illustrating a laser amplifier in accordance with a thirteenth embodiment of the invention.

FIG. 16 is a sectional view illustrating a laser amplifier in the resonator length direction according to a thirteenth embodiment of the invention. In the figure, the same reference numerals as in FIG. 1 designate the same or corresponding parts. Reference numeral 9 designates a film coating having a relatively low reflectivity, for example, less than 1%. This laser amplifier comprises a laser diode having the same energy band structure as described for the first embodiment of the invention and low reflectivity or non-reflective films coating opposite resonator facets of the laser diode. This laser amplifier is fabricated in the same process employing MOCVD as described with respect to the first embodiment.

Figure 28:
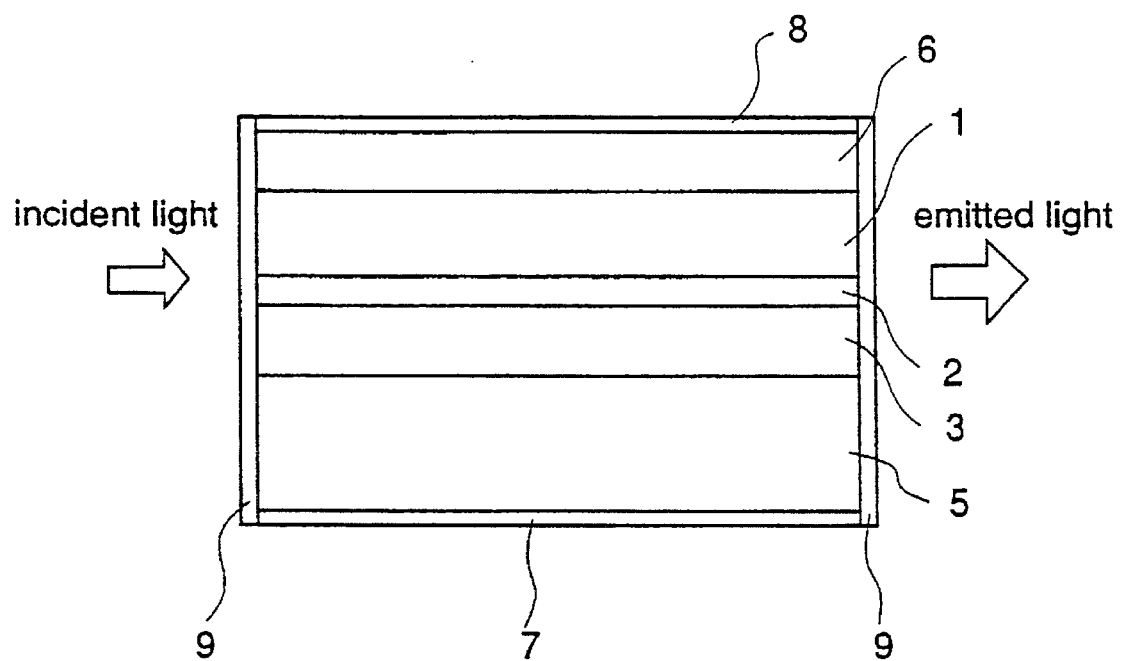
FIG. 28 is a sectional view illustrating a laser amplifier according to the prior art.

FIG. 28 is a sectional view of a prior art laser amplifier in the resonator length direction. In FIG. 28, the same reference numerals as in FIG. 16 designate the same or corresponding parts.

In the prior art laser amplifier shown in FIG. 28, since the resonator facets are coated with the low reflectivity films 9, even when a current flows between the p side electrode 7 and the n side electrode 8, no feedback of light occurs, so that the laser does not oscillate. However, since the active layer 2 has a gain, laser light incident on one of the resonator facets is amplified and laser light having an intensity higher than that of the incident light is emitted from the other resonator facet. In the prior art laser amplifier, even when the fluctuation of the incident light is small, since charge carriers are injected into the active layer 2 at random to produce laser light and the laser light is amplified by the charge carriers, the fluctuation of the amplified output light is considerable.

On the other hand, in the laser amplifier according to the thirteenth embodiment of the invention, the undoped InP layer 4 is interposed between the active layer 2 and the p type InP cladding layer 3, and the thickness of the undoped InP layer 4 is larger than the diffusion length of holes in the undoped InP layer 4. Accordingly, as described for the first embodiment of the invention, current flowing through the undoped InP layer 4 becomes a space-charge-limited current and the holes are injected into the active layer 2 regularly, not at random. The holes injected into the active layer 2 recombine with electrons to produce laser light with small fluctuation. The laser light with small fluctuation is amplified in the laser amplifier, and an amplified laser light with small fluctuation is output from the amplifier. In addition, as described for the first embodiment, the heat generation of the laser amplifier is negligible. As a result, a laser amplifier with reduced heat generation and reduced fluctuation of light is realized.

While in the thirteenth embodiment an energy band structure according to the first embodiment is applied to an laser amplifier, the energy band structure according to any of the second to twelfth embodiments of the invention may be applied to the laser amplifier.

Embodiment 14

Figure 17:
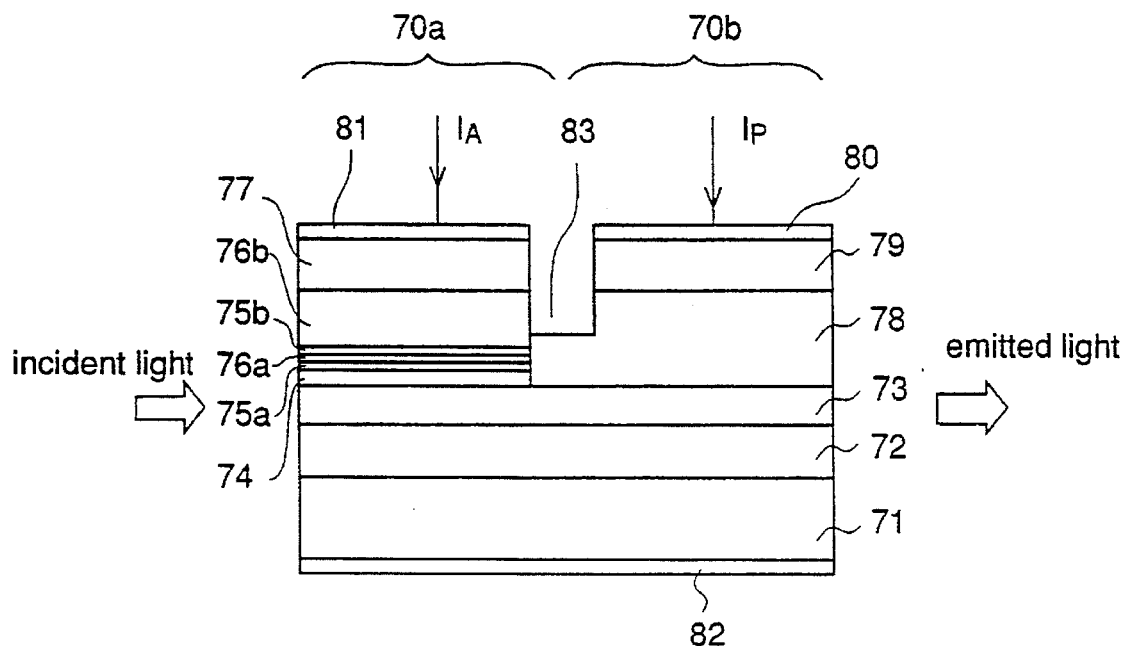
FIGS. 17(a) and 17(b) are sectional views illustrating variable wavelength filters in accordance with a fourteenth embodiment of the present invention.
Figure 17:
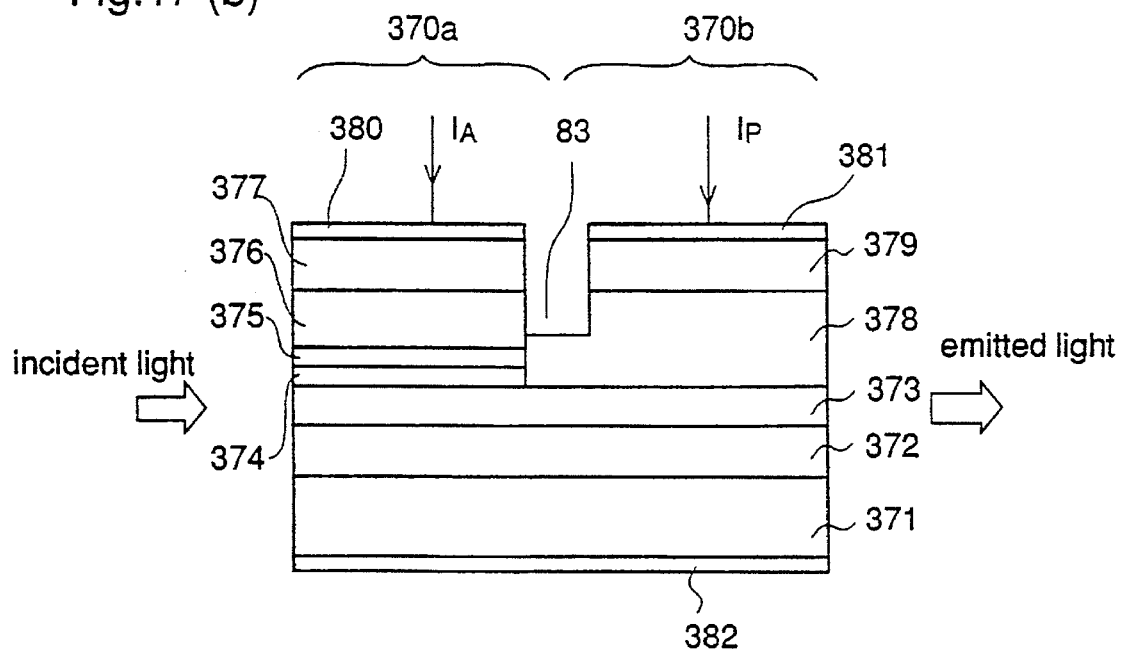

FIG. 17(a) is a sectional view illustrating an integrated light amplifier and variable wavelength filter, taken along the resonator length direction, according to a fourteenth embodiment of the invention. In the figure, reference numerals 70a and 70b designate a light amplifier and a variable wavelength filter, respectively. The light amplifier 70a comprises a p type InP substrate, a p type InP cladding layer 72, a p type InGaAsP guide layer 73, an InGaAsP active layer 74, a second n type $Ga_xIn_{1-x}P$ cladding layer 75a having a thickness t1, first n type InP cladding layers 76a and 76b, a third n type $Ga_xIn_{1-x}P$ cladding layer 75b having a thickness t2 (t2<t1), an n type InGaAsP contact layer 77, an n side electrode 81, and a p side electrode 82. The energy band structure of the light amplifier 70a at a part in the vicinity of the active layer 74 is identical to the energy band structure shown in FIG. 9(a) according to the sixth embodiment of the invention. The variable wavelength filter 70b comprises the p type InP substrate 71, the p type InP cladding layer 72, the p type InGaAsP guide layer 73, an n type InP cladding layer 78, an n type InGaAsP contact layer 79, an n side electrode 80, and the p side electrode 82. Reference numeral 83 designates a separation groove. Reference characters $In_A$ and $In_F$ denote currents flowing to the p side electrode 81 of the amplifier 70a and the p side electrode 80 of the filter 70b, respectively. The light amplifier 70a and the variable wavelength filter 70b are fabricated simultaneously on the p type InP substrate 71.

Initially, there are successively grown on the p type InP substrate 71, the p type InP cladding layer 72, the p type InGaAsP guide layer 73, the InGaAsP active layer 74, the second n type $Ga_xIn_{1-x}P$ cladding layer 75a, the first n type InP cladding layer 76a, the third n type $Ga_xIn_{1-x}P$ cladding layer 75b, the first n type InP cladding layer 76b, and the n type InGaAsP contact layer 77. Preferably, these layers are grown by MOCVD. Thereafter, a portion of the laminated structure from the center in what becomes the resonator length direction to a facet of the variable wavelength filter is selectively etched and removed using a mask or the like until the p type InGaAsP guide layer 73 is exposed. Then, the n type InP cladding layer 78 and the n type InGaAsP contact layer 79 are successively grown on the exposed surface of the guide layer 73, preferably by MOCVD. Thereafter, portions of the cladding layer 78 and the contact layer 79 contacting the first n type InP cladding layer 76b and the n type InGaAsP contact layer 77 are etched and removed to form the separation groove 83. Finally, the p side electrodes 81 and 80 are formed on the contact layers 77 and 79, respectively, and the n side electrode 82 is formed on the rear surface of the substrate 71. Preferably, these electrodes are formed by vapor deposition.

Figure 29:
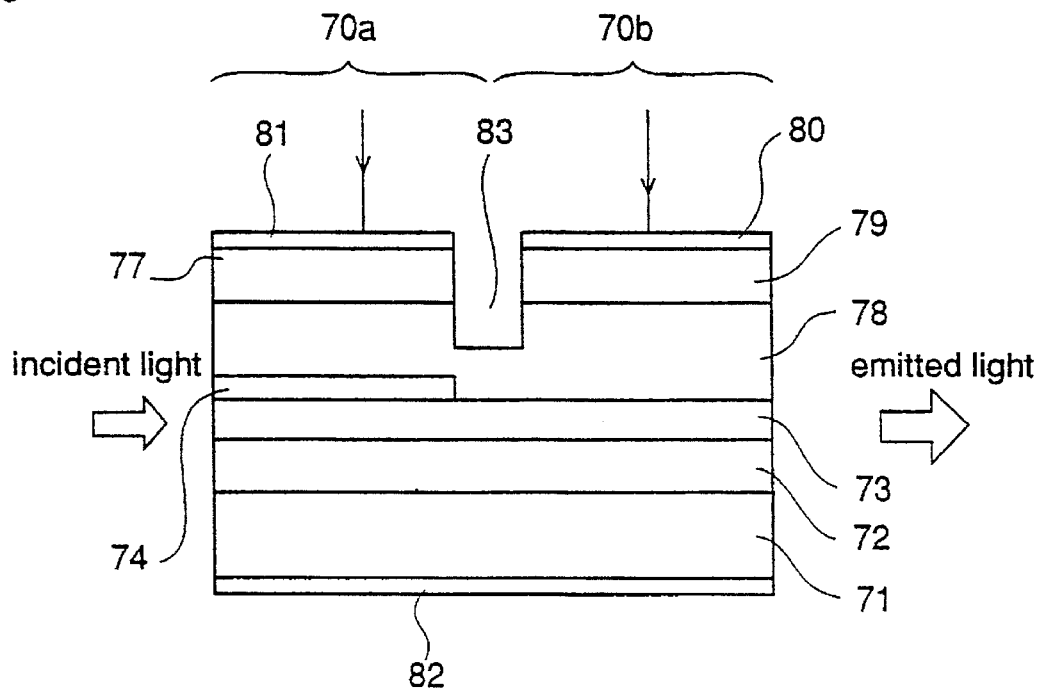
FIG. 29 is a sectional view illustrating an integrated amplifier and variable wavelength filter according to the prior art.

FIG. 29 is a sectional view of a prior art integrated light amplifier and variable wavelength filter taken along the resonator length direction, disclosed in *Journal of Lightwave Technology*, Volume 10, pages 1590 to 1596 (hereinafter referred to as JLT). In the figure, the same reference numerals as in FIG. 17 designate the same or corresponding parts.

According to JLT, in the prior art integrated light amplifier and variable wavelength filter shown in FIG. 29, gain is obtained by the flow of current $I_A$ from the electrode 81 of the light amplifier 70a, and current $I_P$ flowing from the electrode 80 of the variable wavelength filter 70b is varied to change the refractive index in the vicinity of the guide layer 73, whereby the effective resonator length is changed. Thus, from the laser light incident on the guide layer 73, only a portion having a wavelength $\lambda_n$ that varies in response to the current $I_P$ is selected and amplified. However, since charge carriers are injected into the active layer 74 at random, even though the incident laser light has only a small fluctuation, the output laser light has considerable fluctuation.

On the other hand, in the integrated light amplifier and variable wavelength filter according to the present invention, laser light having a wavelength $\lambda$ is selected by varying the current $I_P$ and the laser light is amplified by the current $I_A$, as in the prior art device. Since the band gap energy of the third cladding layer 75b is larger than the band gap energy of the first n type cladding layers 76a and 76b, when the third cladding layer 75b is as thin as 100 Å, electrons in the first n type cladding layer 76b pass through the third cladding layer 75b by tunneling and reach the first cladding layer 76a. Those electrons in the first cladding layer 76a pass through the second cladding layer 75a by tunneling and reach the active layer 74 if the thickness t1 of the second cladding layer 75a is larger than the thickness t2 of the third cladding layer 75b, for example, 150 Å. Since t1 is larger than t2, it is harder for the electrons to pass through the second cladding layer 75a than through the third cladding layer 75b, so that the electrons accumulate in the first cladding layer 76a and there is Coulomb repulsion between the accumulated electrons. Thereby, the current flowing through the first cladding layer 76a becomes a space-charge-limited current, and the electrons are injected into the active layer 74 regularly, not at random. Since the regularly injected electrons produce laser light, $\lambda_n$ wavelength laser light with small fluctuation is emitted.

In the integrated light amplifier and variable wavelength filter according to the fourteenth embodiment of the invention, since the light amplifier section 70a has the same energy band structure as described in the sixth embodiment of the invention, a light amplifier with reduced heat generation and reduced fluctuation of laser light is realized.

While in the fourteenth embodiment the light amplifier 70a has the energy band structure according to the sixth embodiment of the invention, the energy band structures described for the first to fifth and seventh to twelfth embodiments of the invention may be applied to the light amplifier. For example, FIG. 17(b) illustrates a sectional view of an integrated light amplifier and variable wavelength filter employing the energy band structure according to the first embodiment of the invention. The structure shown in FIG. 17(b) is fundamentally identical to the structure shown in FIG. 17(a) except that the respective layers and electrodes have opposite conductivity types from those described with respect to FIG. 17(a), and an undoped InP layer 375 is interposed between an active layer 374 and a p type InP cladding layer in the light amplifier section in place of the second and third $Ga_xIn_{1-x}P$ cladding layers 75a and 75b.

While in the fourteenth embodiment emphasis has been placed upon an InGaAsP integrated light amplifier and variable wavelength filter, a similar structure comprising AlGaAs or AlGaInP series materials is also within the scope of the present invention.

Furthermore, the structure according to this fourteenth embodiment may be applied to an integrated light amplifier and variable wavelength filter having a diffraction grating in the amplifier section as disclosed in *IEEE Journal of Quantum Electronics*, Volume 28, pages 1508–1512, or an integrated light amplifier and multi-electrode variable wavelength filter having a diffraction grating in the amplifier section as disclosed in *IEEE Journal of Quantum Electronics*, Volume 28, pages 1513–1519.

Embodiment 15

Figure 18:
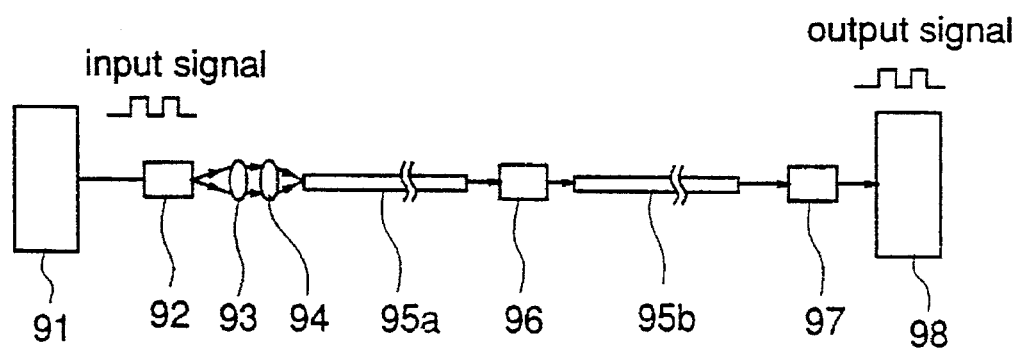
FIG. 18 is a schematic diagram illustrating an optical communication system in accordance with a fifteenth embodiment of the present invention.

FIG. 18 is a schematic diagram illustrating an optical communication system in accordance with a fifteenth embodiment of the invention. This optical communication system includes a laser diode described as the first embodiment and a laser amplifier described as the thirteenth embodiment. In the figure, reference numeral 91 designates a laser diode driving circuit, 92 a laser diode according to the first embodiment of the invention, 93 and 94 lenses, 95a and 95b optical fibers, 96 a laser amplifier according to the thirteenth embodiment of the invention, 97 a photodiode, and 98 an amplifier.

Figure 30:
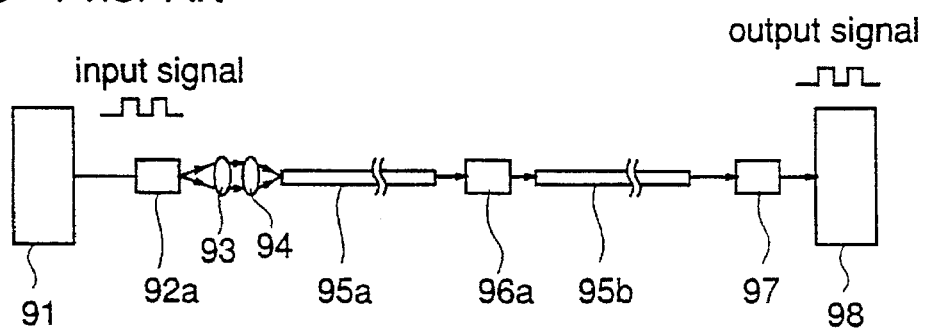
FIG. 30 is a schematic diagram illustrating an optical communication system according to the prior art.

FIG. 30 is a schematic diagram illustrating a prior art optical communication system. In the figure, the same reference numerals as in FIG. 18 designate the same or corresponding parts. Reference numerals 92a and 96a designate a prior art laser diode and a prior art laser amplifier, respectively.

The laser diode 92 is driven in response to a signal output from the laser diode driving circuit 91 and emits laser light. The laser light emitted from the laser diode 92 is collected by the lenses 93 and 94, transmitted through the optical fiber 95a, and applied to the laser amplifier 96. The laser light is amplified in the amplifier 96, and the amplified light is transmitted through the optical fiber 95b to the photodiode 97. The laser light is converted into an output signal in the photodiode 97, and this signal is amplified by the amplifier 98.

In the prior art optical communication system shown in FIG. 30, the fluctuation of laser light emitted from the laser diode 92a is larger than $\sqrt{<n>}$ (<n> is the average number of photons), so that an optical signal with large fluctuation is transmitted through the lenses 93 and 94 to the optical fibers 95a and 95b. The laser amplifier 96a connected to the optical fibers 95a and 95b amplifies the signal and increases the fluctuation of the signal. The optical signal with the increased fluctuation is transmitted through the fiber 95b to the photodiode 97 and converted into a photocurrent in the photodiode 97. This photocurrent is amplified in the amplifier 98. The increase in the fluctuation of the optical signal reduces the receiver sensitivity, i.e., the S/N ratio.

In the optical communication system according to the present invention, however, since the laser diode according to the first embodiment of the invention is employed as the laser diode 92, the fluctuation of the optical signal emitted from the laser diode 92 is smaller than $\sqrt{<n>}$. Further, the laser amplifier according to the thirteenth embodiment of the invention is employed as the laser amplifier 96 interposed between the optical fibers 95a and 95b, the fluctuation during amplification is also reduced. Therefore, the fluctuation of the optical signal emitted from the optical fiber 95b is small, resulting in an optical communication system having a high S/N ratio for long-distance transmission.

While in the fifteenth embodiment the laser amplifier 96 is connected between the optical fibers 95a and 95b, the laser amplifier 96 may be connected between an output end of the fiber 95b and the photodiode 97. In this case, the optical signal output from the fiber 95b is amplified in the amplifier 96 and the amplified signal is sent to the photodiode 97.

While in the fifteenth embodiment a laser diode according to the first embodiment is employed, laser diodes according to the second to twelfth embodiments may be employed with the same effect.

Embodiment 16

Figure 19:
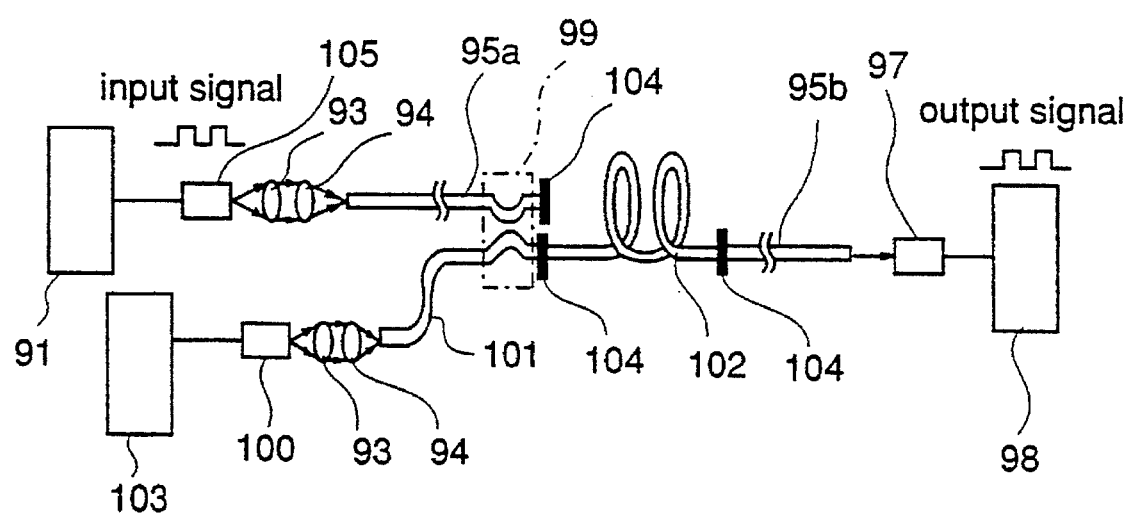
FIG. 19 is a schematic diagram illustrating an optical communication system in accordance with a sixteenth embodiment of the present invention.

FIG. 19 is a schematic diagram illustrating an optical communication system according to a sixteenth embodiment of the invention including laser diodes according to the first embodiment. In the figure, the same reference numerals as in FIG. 18 designate the same or corresponding parts. Reference numeral 105 designates a laser diode that emits laser light at a wavelength of 1.55 µm or 1.3 µm with small fluctuation, according to the first embodiment of the invention. Reference numeral 100 designates a fiber-amplifier-exciting laser diode that emits laser light at a wavelength of 1.48 µm, 0.98 µm, or 1.02 µm with small fluctuation, according to the first embodiment of the invention. Reference numeral 103 designates a driving circuit for the laser diode 100, 101 an optical fiber, 102 an erbium (Er) or praseodymium (Pr) doped optical fiber amplifier, 99 a fiber coupler, and 104 an optical fiber end or an optical fiber connector. A filter (not shown) is inserted between the fiber amplifier 102 and the optical fiber 95b to prevent laser light for exciting the fiber amplifier 102 from reaching the optical fiber 95b after passing through the fiber amplifier 102.

Figure 31:
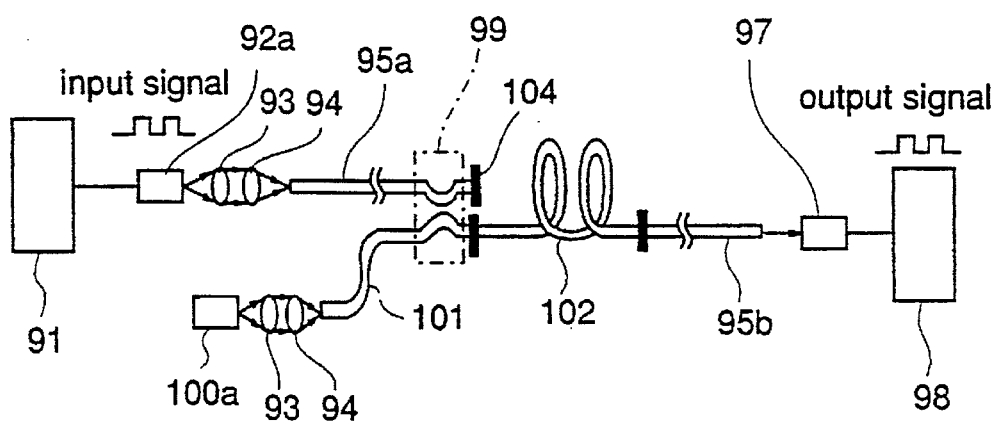
FIG. 31 is a schematic diagram illustrating an optical communication system according to the prior art.

FIG. 31 is a schematic diagram illustrating an optical communication system including prior art laser diodes. In the figure, the same reference numerals as in FIG. 19 designate the same or corresponding parts. Reference numeral 92a designates a prior art laser diode, and reference numeral 100a designates a fiber-amplifier-exciting laser diode having the same structure as the prior art laser diode.

In the prior art optical communication system, an optical signal with relatively large fluctuation is emitted from the laser diode 92a and transmitted through the lenses 93 and 94 to the optical fiber 95a. In the optical fiber 95a, the optical signal is coupled to the Er-doped fiber 102 by the fiber coupler 99. Laser light with relatively large fluctuation is emitted from the fiber-amplifier-exciting laser diode 100a and transmitted through the lenses 93 and 94 and the optical fiber 101 to the Er-doped fiber 102. In the Er-doped fiber 102, the laser light randomly excites electrons in the Er. The excited electrons emit light having the same wavelength as the light emitted from the laser diode 92a when the electrons stimulated by the light from the laser diode 92a fall to the ground level. If many electrons in the Er are excited, the optical signal from the laser diode 92a is amplified. However, since the electrons are excited randomly, the fluctuation of the amplified optical signal is significant. This optical signal with significant fluctuation passes through the optical fiber 95b and is applied to the photodiode 97 wherein a photocurrent is generated. Since the fluctuation of the optical signal is significant, the sensitivity, i.e., the S/N ratio, is reduced.

On the other hand, in the sixteenth embodiment of the invention, the laser diode 105 emits an optical signal having relatively small fluctuation, and the optical signal is transmitted through the lenses 93 and 94 and the optical fiber 95a and coupled to the optical fiber 102 by the fiber coupler 99. The laser diode 100 emits laser light at a wavelength of 1.48 µm, 0.98 µm, or 1.02 µm with relatively small fluctuation, and the emitted laser light is transmitted through the lenses 93 and 94 and the optical fiber 101 to the Er (or Pr) doped fiber amplifier 102. In the Er-doped fiber amplifier 102, the laser light excites electrons of Er. Since the fluctuation of the laser light is small, the electrons are excited regularly, not at random, and fall to the ground level by the stimulation of the laser light at 1.55 or 1.3 µm from the laser diode 105, whereby laser light at 1.55 or 1.3 µm is produced. When there are many excited electrons, the optical signal itself is amplified. The fluctuation of the laser light amplified by the fiber amplifier 102 is small. This laser light with small fluctuation passes through the optical fiber 95b and reaches the photodiode 97 where a photocurrent is produced. Since the fluctuation of the optical signal reaching the photodiode 97 is small, an optical communication system with a high sensitivity, i.e., a high S/N ratio, is realized.

While in the sixteenth embodiment a laser diode according to the first embodiment is employed for the laser diodes 105 and 100, laser diodes according to the second to twelfth embodiments of the invention may be employed with the same effect.

While in the sixteenth embodiment the optical fiber 95b is connected between the fiber amplifier 102 and the photodiode 97, the fiber 95b can be dispensed with. In this case, the optical signal output from the optical fiber 101 is amplified in the fiber amplifier 102 and transmitted to the photodiode 97.

Embodiment 17

Figure 20:
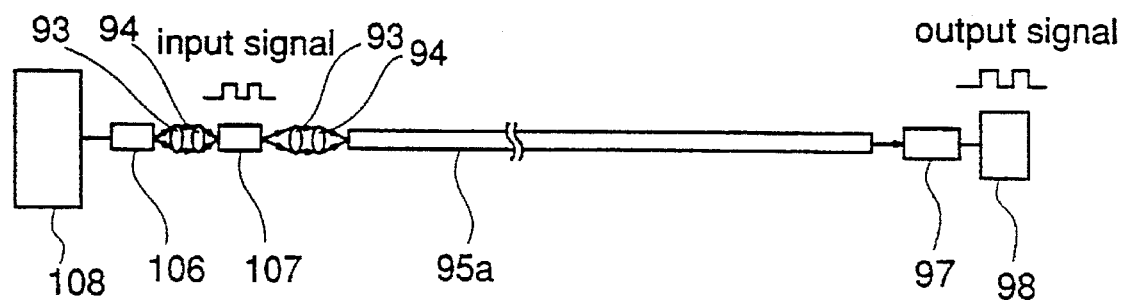
FIG. 20(a) is a schematic diagram illustrating an optical communication system in accordance with a seventeenth embodiment of the present invention.
FIG. 20(b) is a sectional view illustrating a light modulator included in the optical communication system.
Figure 20:
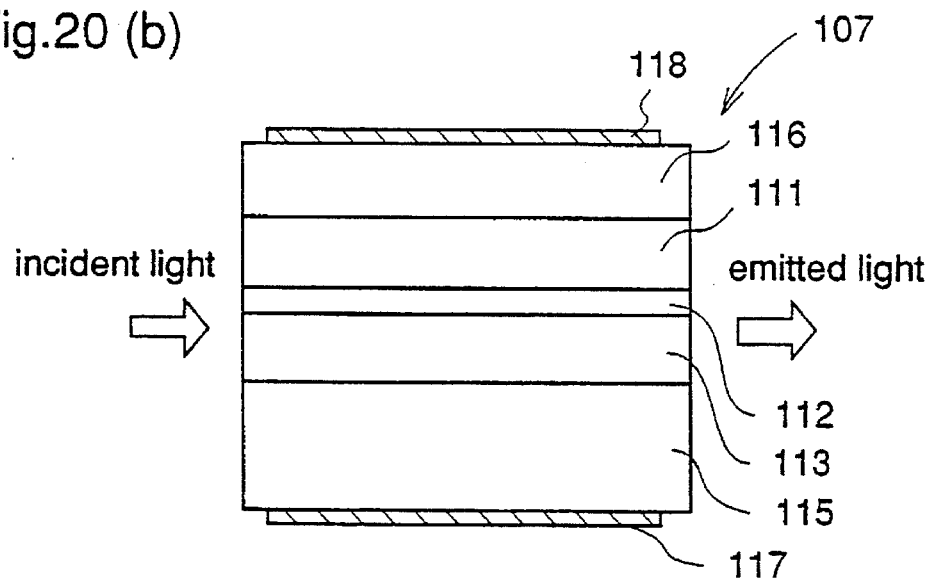

FIG. 20(a) is a schematic diagram illustrating an optical communication system according to a seventeenth embodiment of the invention, and FIG. 20(b) is a sectional view illustrating a light modulator included in the system of FIG. 20(a). In this optical communication system, a laser diode according to any of the first to twelfth embodiments is employed as a light source. Output light from the light source is modulated in a light modulator, transmitted through a fiber, and detected by a receiver.

In FIG. 20(a), the same reference numerals as in FIG. 18 designate the same or corresponding parts. Reference numeral 106 designates a low-noise InGaAsP series laser diode according to the first embodiment of the invention, 107 a light modulator, and 108 a driving circuit for the laser diode 106.

In FIG. 20(b), reference numeral 115 designates a p type InP substrate. A p type InP cladding layer 113 is disposed on the substrate 115. An undoped InGaAs/InGaAsP multiple quantum well layer 112 is disposed on the p type cladding layer 113. An n type InP cladding layer 111 is disposed on the multiple quantum well layer 112. An n type InGaAsP contact layer 116 is disposed on the n type cladding layer 111. An n side electrode 118 is disposed on the contact layer 116, and a p side electrode 117 is disposed on the rear surface of the substrate 115.

As already described, in the laser diode according to the first embodiment of the invention, since the space-charge-limited region has a resistance, the RC time constant increases, whereby the operation band is restricted. Therefore, the laser diode 106 is operated in a continuous wave (CW) mode, light emitted from the laser diode 106 is modulated by the modulator 107 to produce an optical signal, and the optical signal is transmitted through the optical fiber 95a.

In the light modulator 107 shown in FIG. 20(b), as described in *Journal of Lightwave Technology*, Volume 6, pages 743–757 (1988), by appropriately selecting the thicknesses of the well layer and the barrier layer and the composition of the barrier layer included in the undoped InGaAs/InGaAsP multiple quantum well structure 112, the output light from the laser diode 106 passes through the modulator 107 when no bias is applied to the modulator 107. When a reverse bias is applied to the modulator 107, the output light is prevented from passing through the modulator 107 by the quantum-confined Stark effect. Therefore, the laser light with relatively small fluctuation emitted from the laser diode 106 is converted into an optical signal in the light modulator 107, so that a high frequency band and high sensitivity optical communication system is realized by reducing the RC time constant of the light modulator 107.

While in the seventeenth embodiment a laser diode according to the first embodiment is employed for the laser diode 106, a laser diode according to any of the second to twelfth embodiments may be employed with the same effect.

Embodiment 18

Figure 21:
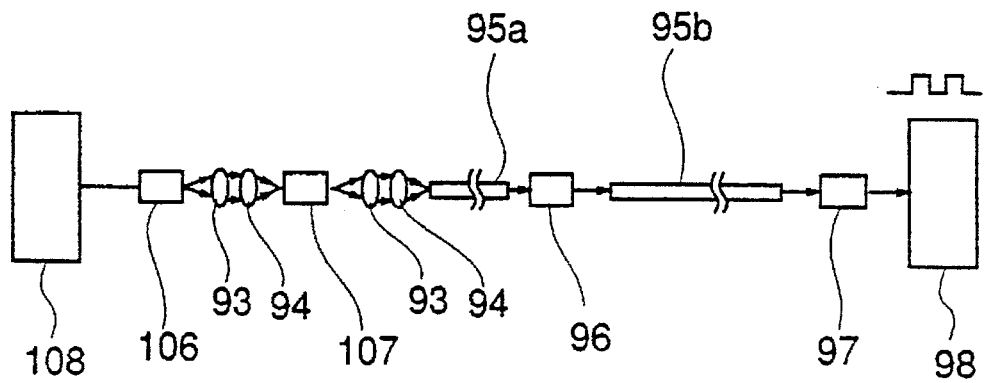
FIG. 21 is a schematic diagram illustrating an optical communication system in accordance with an eighteenth embodiment of the invention.

FIG. 21 is a schematic diagram illustrating an optical communication system in accordance with an eighteenth embodiment of the invention. The structure of this optical communication system is fundamentally identical to the structure shown in FIG. 20(a) except that a laser amplifier as described in the thirteenth embodiment is inserted in the middle of the optical fiber.

In this optical communication system, in addition to the effects of the thirteenth embodiment, the optical signal that is emitted from the laser amplifier 106 and attenuated while passing through the optical fiber 95a can be amplified with no fluctuation and then transmitted to the optical fiber 95b, whereby an optical communication system for long-distance transmission is realized.

Embodiment 19

Figure 22:
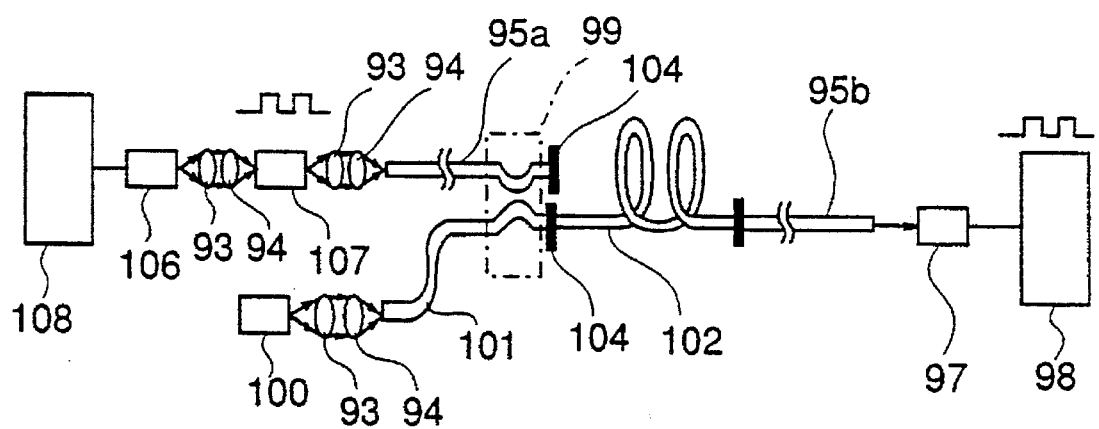
FIG. 22 is a schematic diagram illustrating an optical communication system in accordance with a nineteenth embodiment of the invention.

FIG. 22 is a schematic diagram illustrating an optical communication system in accordance with a nineteenth embodiment of the invention. In the figure, the same reference numerals as in FIGS. 19 and 20 designate the same or corresponding parts. In this nineteenth embodiment, in the optical communication system according to the sixteenth embodiment of the invention, the laser diode driving circuit 108, the laser diode 106, and the light modulator 107 are employed in place of the laser diode 92 and the laser diode driving circuit 91.

Also in this embodiment, the same effects as described for the sixteenth embodiment are achieved. Further, since the laser diode 106 is operated in the CW mode and the emitted laser light is converted into an optical signal in the light modulator 107 and applied to the optical fiber, a high sensitivity and long wavelength band optical communication system is realized.

Although in this nineteenth embodiment the laser diode 106 and the light modulator 107 are separated from each other, these elements may be united.

While in the eighteenth and nineteenth embodiments the laser amplifier 96 and the fiber amplifier 102 are inserted between the optical fibers 95a and 95b, the optical fiber 95b may be dispensed with and the laser amplifier and the fiber amplifier may be connected between the optical fiber 95a and the photodiode 97.

Embodiment 20

Figure 23:
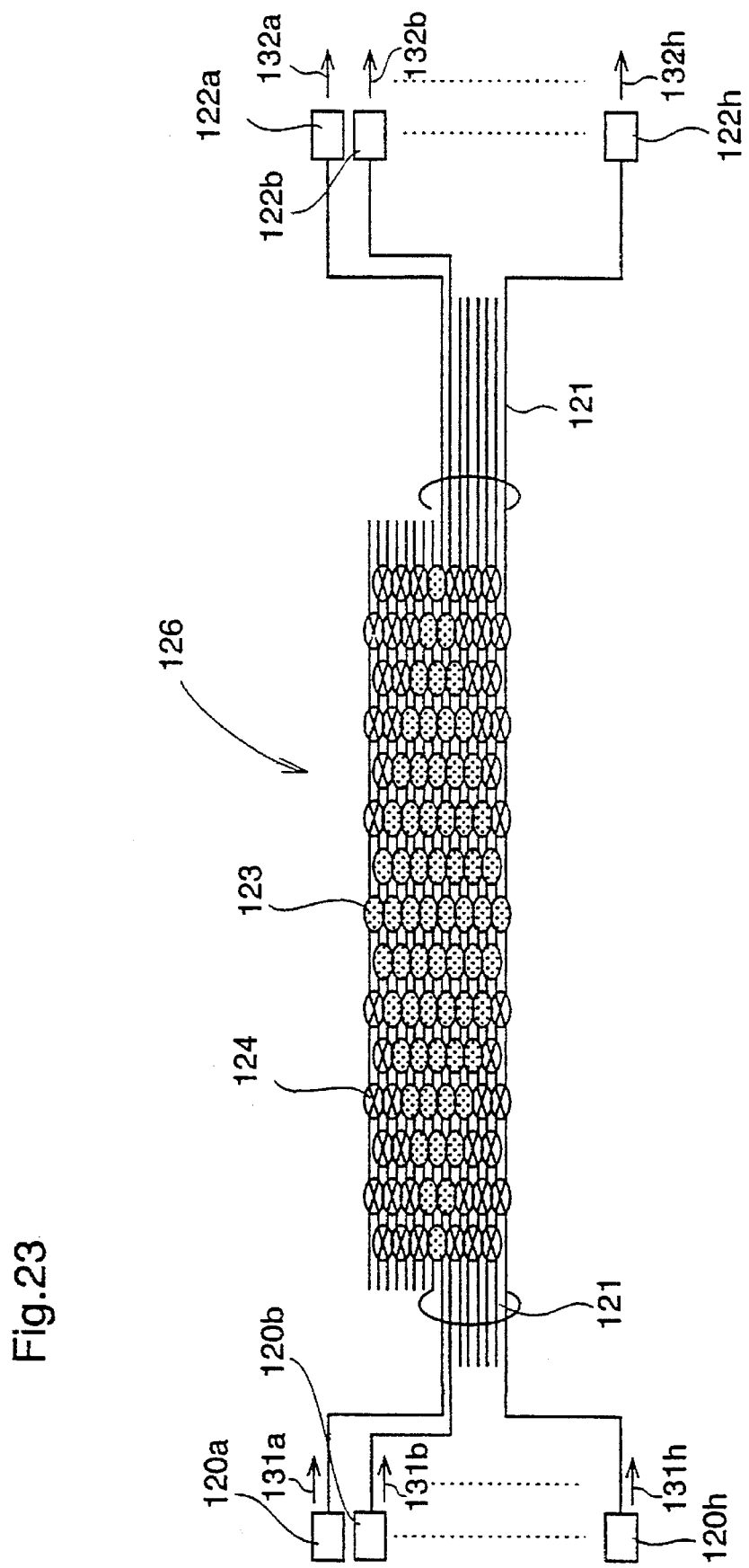
FIG. 23 is a schematic diagram illustrating a space division optical switch in accordance with a twentieth embodiment of the invention.

FIG. 23 is a schematic diagram illustrating a space division optical switch system in accordance with a twentieth embodiment of the present invention. In this space division optical switch system, laser diodes according to any of the first to thirteenth embodiments of the invention are employed as light sources, and optical signals transmitted through a space division optical switch are amplified by laser amplifiers according to the thirteenth embodiment of the invention.

More specifically, in FIG. 23, reference numerals 120a to 120h designate InGaAsP series laser diodes in accordance with the first embodiment of the invention. Reference numerals 122a to 122h designate laser amplifiers in accordance with the thirteenth embodiment of the invention. Reference numeral 126 designates a space division optical switch. Reference numeral 121 designates an optical waveguide. The space division optical switch 126 comprises a plurality of optical switch elements 123 for directly passing or switching light input to the optical switch 126 through the waveguide 121, and a plurality of optical switch elements 124 for crossing the light. These optical switch elements 123 and 124 are connected to an electrical circuit (not shown) for driving these switch elements. Reference numerals 131a to 131h designate input optical signals, and numerals 132a to 132h designate output optical signals. In the space division optical switch system, the courses of the input optical signals 131a to 11h input to the optical switch 126 from the laser diodes 120a to 120h through the optical waveguide 121 are changed by the optical switch elements 123 and these optical signals are output as any of the output optical signals 132a to 132h. The optical switch elements 124 located at crossing points equalize the propagation loss of each of the input signals 131a to 131h in the optical switch 126.

Figure 32:
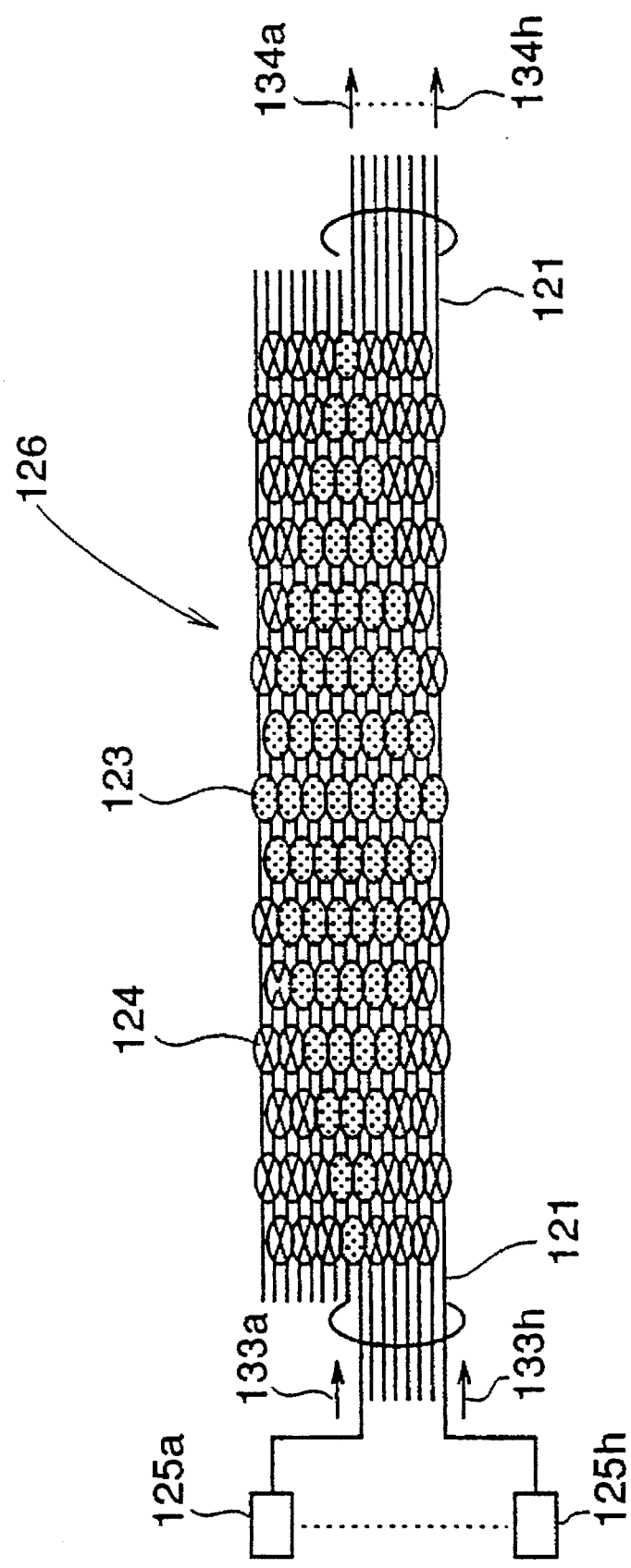
FIG. 32 is a schematic diagram illustrating a space division optical switch according to the prior art.

FIG. 32 is a schematic diagram illustrating a prior art space division optical switch system disclosed in *Technical Digest of ECOC'90*, pages 545–548. In the figure, the same reference numerals as in FIG. 23 designate the same or corresponding parts. Reference numerals 133a to 133h designate input optical signals, 134a to 134h output optical signals, and 125a to 125h prior art laser diodes.

In this prior art space division switch system, each of the optical signals 133a to 133h emitted from the respective laser diodes 125a to 125h has significant fluctuation, and the intensity of each of the output optical signals 134a to 134h is reduced to about 1/10.

In the space division optical switch according to this twentieth embodiment, however, the fluctuation of each of the optical signals 131a to 131h emitted from the respective laser diodes 120a to 120h is small, and these optical signals 131a to 131h are switched while passing through the space division optical switch 126, amplified in the laser amplifiers 122a to 122b without increasing fluctuation, and output as the optical signals 132a to 132h. Accordingly, a space division optical switch that provides amplified optical signals with small fluctuation is realized.

Embodiment 21

Figure 24:
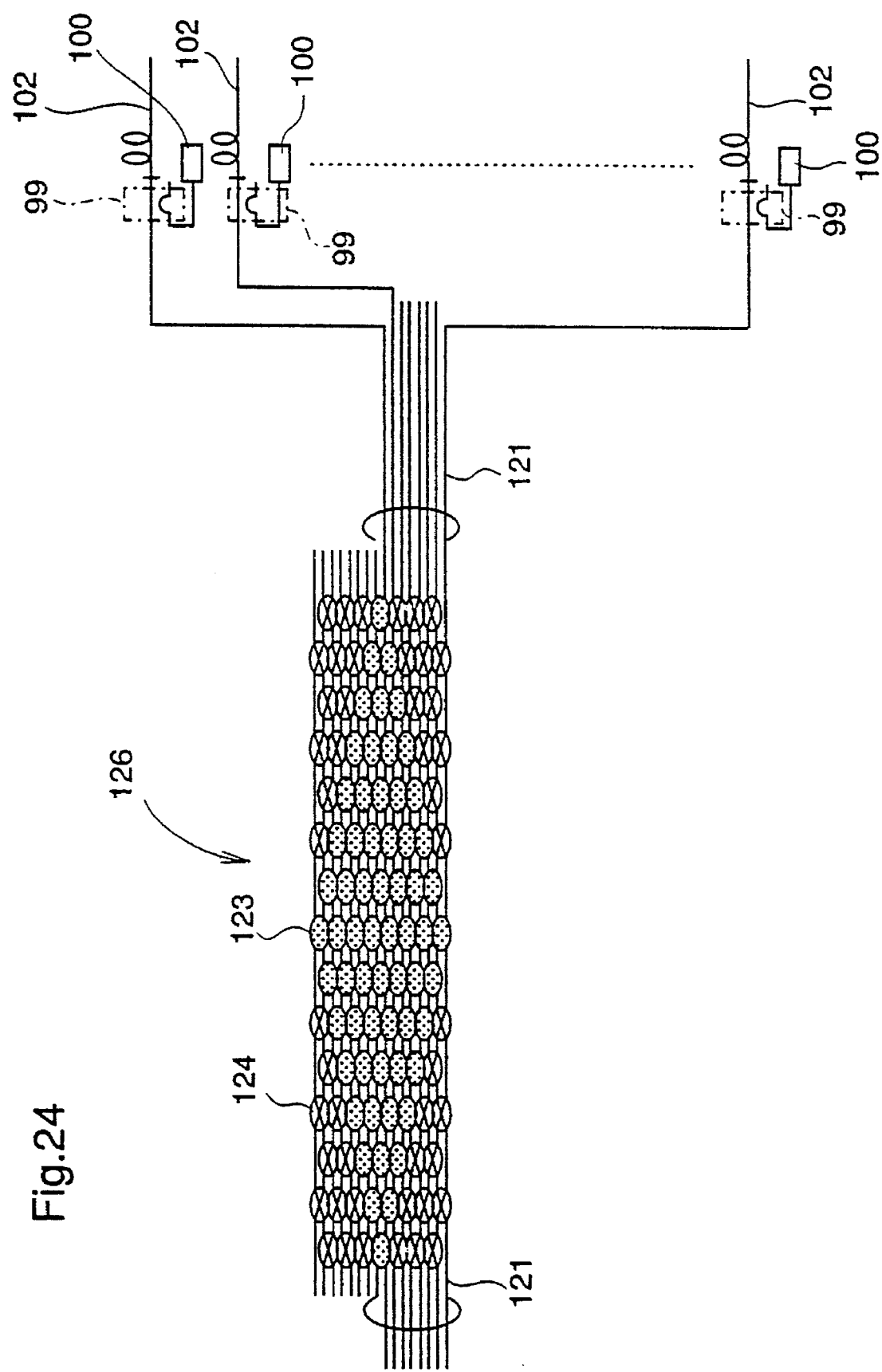
FIG. 24 is a schematic diagram illustrating a space division optical switch in accordance with a twenty-first embodiment of the invention.

FIG. 24 is a schematic diagram illustrating a space division optical switch system in accordance with a twenty-first embodiment of the invention. In FIG. 24, the same reference numerals as in FIGS. 19 and 23 designate the same or corresponding parts.

The space division optical switch system according to this twenty-first embodiment is fundamentally identical to the space division optical switch system according to the twentieth embodiment except that an amplifying means comprising a fiber amplifier 102, a fiber coupler 99, and a fiber-amplifier-exciting laser diode 100 according to the sixteenth embodiment is employed in place of the laser amplifier. Also in this case, the same effects as described in the twentieth embodiment are achieved.

Embodiment 22

Figure 25:
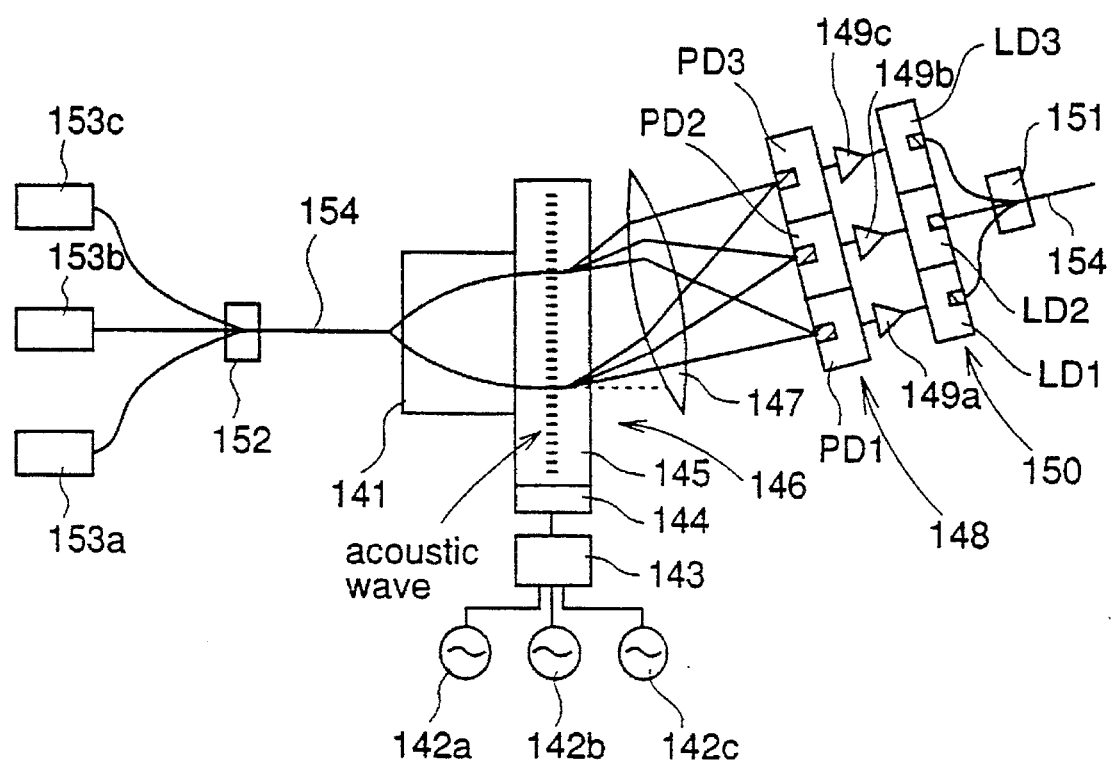
FIG. 25 is a schematic diagram illustrating a wavelength division optical switch in accordance with a twenty-second embodiment of the present invention.

FIG. 25 is a schematic diagram illustrating a wavelength division optical switch in accordance with a twenty-second embodiment of the present invention. This wavelength division optical switch includes laser diodes 153a, 153b, 153c, LD1, LD2, and LD3 having the same structure as the laser diode according to the first embodiment of the invention. Laser diodes according to the second to twelfth embodiments are also applicable. Reference numeral 152 designates a coupler, 154 an optical waveguide, 141 a collimating lens, 142a to 142c oscillators, 143 a multicoupler, 144 an electroacoustic transducer, 145 an acoustooptic medium comprising quartz, $PbMoO_4$, $TeO_2$, $LiNbO_3$, or Ge, 146 an acoustooptic deflector, 147 a focusing lens, 148 a PD (photodiode) array comprising photodiodes PD1, PD2, and PD3, 149a to 149c amplifiers, 150 an LD (laser diode) array comprising laser diodes LD1, LD2, and LD3, and 151 a coupler.

Figure 33:
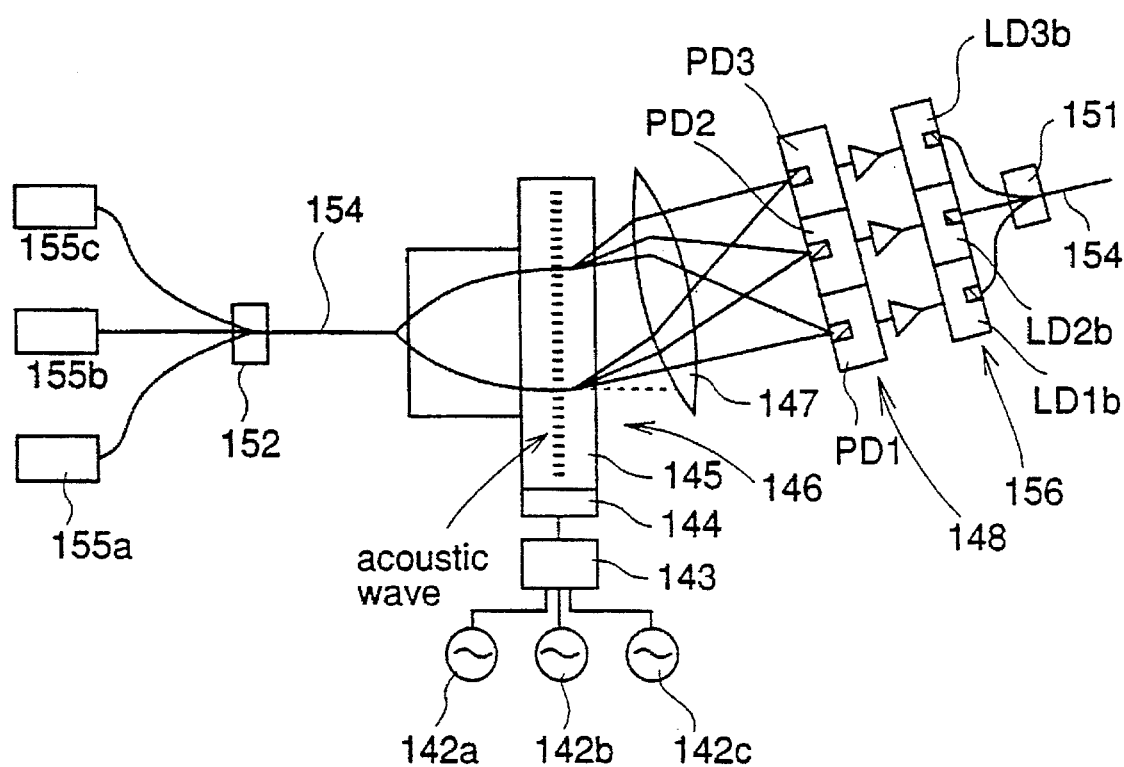
FIG. 33 is a schematic diagram illustrating a wavelength division optical switch according to the prior art.

FIG. 33 is a schematic diagram illustrating a structure of a prior art wavelength division optical switch system disclosed in *Journal of Lightwave Technology*, Volume LT5, pages 1742 to 1747 (1987). In the figure, the same reference numerals as in FIG. 25 designate the same or corresponding parts. This wavelength division optical switch system includes prior art laser diodes 155a to 155c and an LD array comprising prior art laser diodes LD1b, LD2b, and LD3b.

A description is given of the operation of the wavelength division optical switch system shown in FIG. 25. Input optical signals with different wavelengths λ1, λ2, and λ3 are multiplexed on an input optical line in the coupler 141. The collimating lens 141 transforms the optical signals into a collimated beam. The beam enters the acoustooptic deflector 146. The optical signals with different wavelengths λ1, λ2, and λ3 are deflected at different angles in the acoustooptic deflector 146 and applied to the photodiodes PD3, PD2, and PD1, respectively, through the focusing lens 147. The respective photodiodes PD1, PD2, and PD3 produce photoelectric currents. These currents are amplified by the amplifiers 149a to 149c and converted into optical signals with wavelengths λ3, λ2, and λ1 by the laser diodes LD1, LD2, and LD3, respectively. These optical signals are multiplexed on an output optical line in the coupler 151 and output toward an optical fiber or an optical waveguide (not shown). This wavelength division optical switch converts signals with wavelengths λ1, λ2, and λ3 into signals with wavelengths λ3, λ2, and λ1, respectively.

In the prior art wavelength division optical switch system shown in FIG. 33, optical signals with different wavelengths λ1, λ2, and λ3 that are output from the prior art laser diodes 155a to 155c, respectively, have relatively large fluctuation, and these optical signals are amplified by the prior art laser diodes LD3b, LD2b, and LD1b that increase fluctuation. Therefore, output optical signals with wavelengths λ3, λ2, and λ1 have considerable fluctuation.

In the wavelength division optical switch system according to this embodiment of the invention, since the input optical signals with different wavelengths λ1, λ2, and λ3 are output from the light sources comprising the laser diodes 153a to 153c having the same structure as the laser diode according to the first embodiment, the fluctuation of each input signal is relatively small. In addition, since the laser diodes LD1 to LD3 of the laser diode array 150 have the same structure as a laser diode according to the first embodiment, the fluctuation of light emitted from each laser diode is relatively small. Therefore, the input optical signals with different wavelengths λ1, λ2, and λ3, each having small fluctuation, are emitted from the laser diodes 153a to 153c, respectively, separated by the acoustooptic deflector 146, converted into photoelectric currents by the PD array 148, amplified by the amplifiers 149a to 149c, and output from the LD array 150 as output optical signals with wavelengths λ3, λ2, and λ1, each having small fluctuation.

As a result, according to the twenty-second embodiment of the invention, a wavelength division optical switch system in which optical signals with different wavelengths and small fluctuation are output as optical signals with inverted or different wavelengths and small fluctuation is realized.

Although in this twenty-second embodiment of the invention emphasis has been placed upon a wavelength division optical switch system using three input optical signals with different wavelengths, the number of input optical signals with different wavelengths is not restricted to three.

Further, although an acoustooptic deflector is employed for dividing an input optical signal into signals of different wavelengths, a variable wavelength filter as described in *Applied Physics Letters*, Volume 53, pages 83–85 (1988), a diffraction grating, or a hologram may be employed with the same effect.

Embodiment 23

Figure 26:
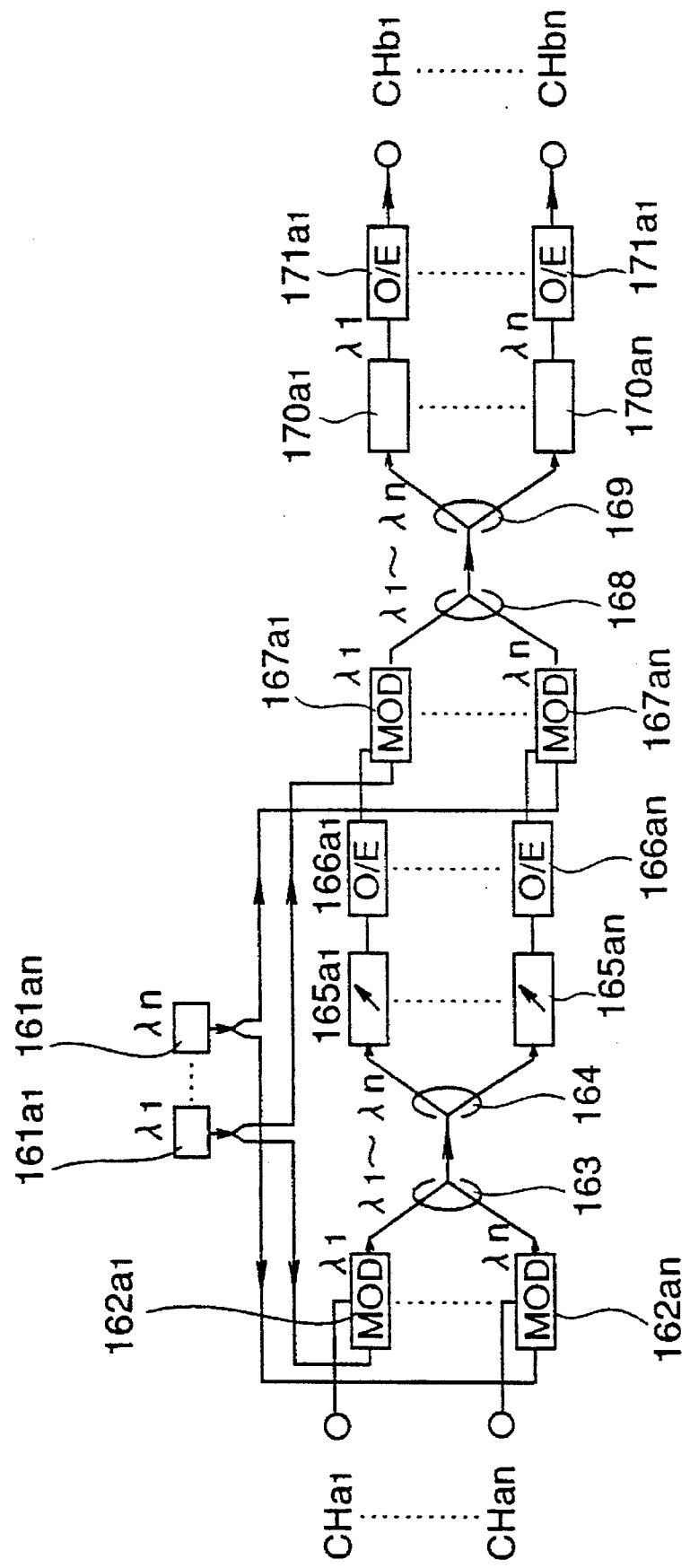
FIG. 26 is a schematic diagram illustrating a wavelength division optical switch in accordance with a twenty-third embodiment of the present invention.
Figure 27:
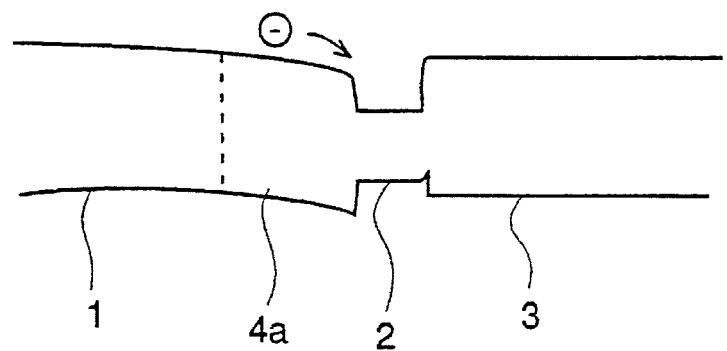
FIG. 27 is a schematic diagram illustrating an energy band structure in a region adjacent to an active layer of a laser diode according to the prior art.

FIG. 26 is a block diagram illustrating a wavelength division optical switch system including laser diodes according to any of the first to twelfth embodiments of the invention as light sources and variable wavelength filters according to the fourteenth embodiment of the invention as wavelength division amplifiers. More specifically, reference numerals $161a_1$ to $161a_n$ are diodes each having the same structure as the laser diode described as the first embodiment of the invention, $162a_1$ to $162a_n$ are modulators, 163 is a combiner, 164 is a splitter, $165a_1$ to $165a_n$ are variable wavelength filters each having the same structure as the integrated amplifier and variable wavelength filter described as the fourteenth embodiment of the invention, $166a_1$ to $166a_n$ are optical-electronic (O/E) converters, for example, photodiodes $167a_1$ to $167a_n$ are modulators, 168 is a combiner, 169 is a splitter, $170a_1$ to $170a_n$ are fixed wavelength filters, $171a_1$ to $171a_n$ O/E are converters, $CHa_1$ to $CHa_n$ are input terminals for applying signals to the modulators $162a_1$ to $162a_n$, and $CHb_1$ to $CHb_n$ are output terminals.

Figure 34:
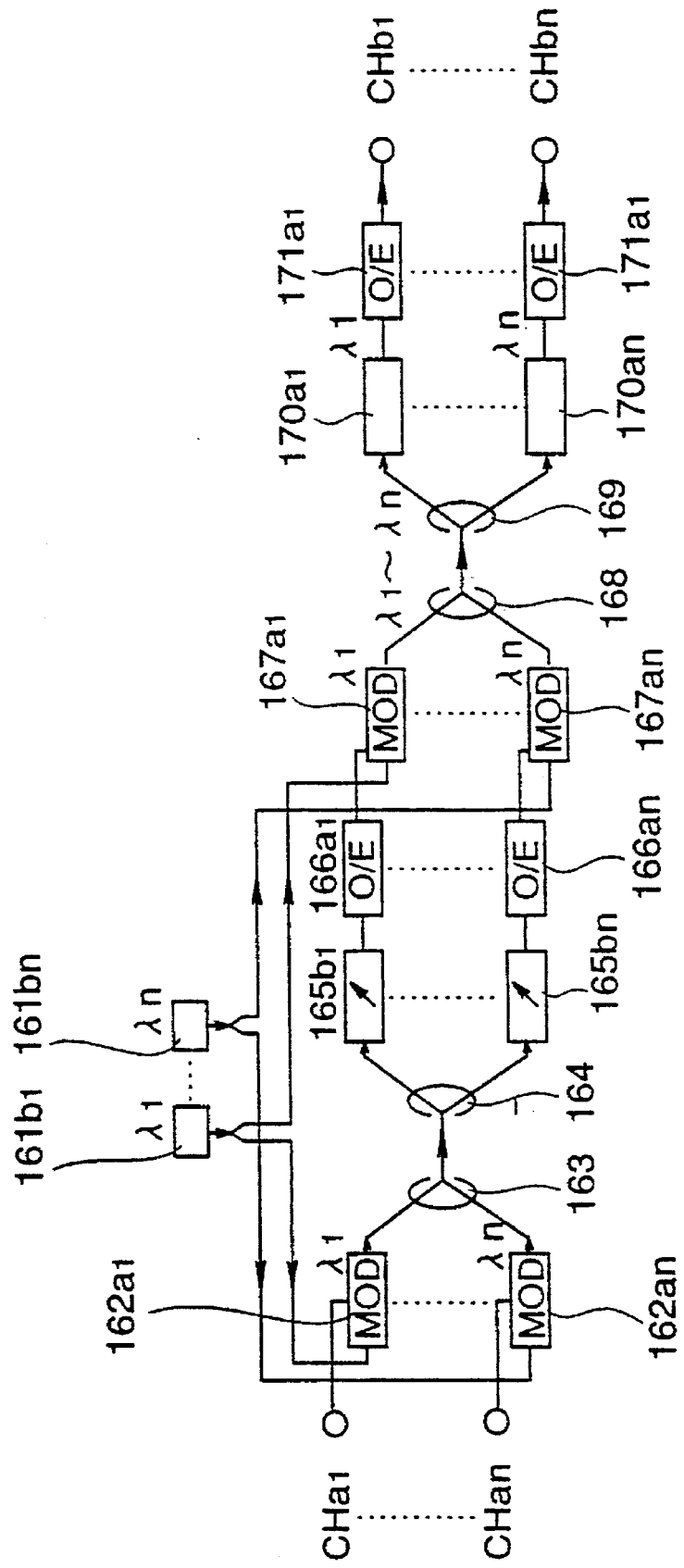
FIG. 34 is a schematic diagram illustrating a wavelength division optical switch according to the prior art.

FIG. 34 is a block diagram illustrating a prior art wavelength division optical switch system including a variable wavelength filter disclosed in *Journal of Lightwave Technology*, Volume 8, pages 660 to 666 (1990). In the figure, the same reference numerals as in FIG. 26 designate the same or corresponding parts. This optical switch system includes prior art laser diodes $161b_1$ to $161b_n$ and prior art variable wavelength filters $165b_1$ to $165b_n$ as shown in FIG. 29.

A description is given of the wavelength division optical switch system shown in FIG. 26. The laser diodes $161a_1$ to $161a_n$ respectively emit light beams of different wavelengths λ1 to λn. Each of the emitted light beams, for example, the light beam at a wavelength λ1 emitted from the laser diode $161a_1$, is divided into n beams and applied to the modulators $162a_1$ to $162a_n$, respectively. On the other hand, signals from the input terminals $CHa_1$ to $CHa_n$ enter the modulators $162a_1$ to $162a_n$, respectively, and optical signals having wavelengths of $λa_1$ to $λa_n$ are produced. These optical signals are combined by the combiner 163 and split by the splitter 164. The split light beams are input to the variable wavelength filters $165a_1$ to $165a_n$. For example, when the split light is input to the variable wavelength filter $165a_1$, only a signal component having a wavelength λa is selected from the input light and amplified. This amplified optical signal is converted into an electrical signal in the O/E converter $166a_1$. This electrical signal is converted in the modulator $167a_1$ to a modulated optical signal having a wavelength λ1. The optical signal with a wavelength λα is converted into an optical signal with a wavelength λ1. Likewise, optical signals other than the optical signal of the wavelength λα are processed in the same manner as described above and converted into optical signals having wavelengths of λ2 to λn. The optical signals output from the modulators $167a_1$ to $167a_n$ are combined by the combiner 168, split by the splitter 169, and sent to the fixed wavelength filters $170a_1$ to $170a_n$. The fixed wavelength filters select signal components having wavelengths $λa_1$ to $λa_n$ from the input optical signals, respectively. The selected signal components are input to the O/E converters $171a_1$ to $171a_n$, converted into electrical signals, and output to the output terminals $CHb_1$ to $CHb_n$, respectively. When the optical signals with wavelengths of λ1 to λn are split into n signals, the intensity of each optical signal is reduced to 1/n. However, since the variable wavelength filters $165a_1$ to $165a_n$ include optical amplifiers, the intensity of the optical signal is compensated by the variable wavelength filter.

Since the prior art wavelength division optical switch shown in FIG. 34 includes the prior art laser diodes $161b_1$ to $161b_n$, optical signals with large fluctuations are amplified in the prior art variable wavelength filters $165b_1$ to $165b_n$, increasing the fluctuations. These optical signals with increased fluctuations are transmitted through the O/E converters $166a_1$ to $166a_n$ to the modulators $167a_1$ to $167a_n$. As a result, the O/E converters $171a_1$ to $171a_n$ output electrical signals with significant fluctuations.

In this twenty-third embodiment of the invention, however, since a laser diode providing small fluctuation of light according to any of the first to twelfth embodiments of the invention is employed, optical signals input to the modulators $162a_1$ to $162a_n$ and $162a_1$ to $162a_n$ have small fluctuations. In addition, since the variable wavelength filter according to the fourteenth embodiment of the invention is employed, the variable wavelength filters $165a_1$ to $165a_n$ amplify the optical signals with small fluctuations without increasing the fluctuations. As a result, the electrical signals output from the O/E converters $171a_1$ to $171a_n$ have small fluctuations.

As described above, according to the twenty-third embodiment of the invention, since a laser diode according to any of the first to twelfth embodiments and an integrated light amplifier and variable wavelength filter according to the fourteenth embodiment are employed, a wavelength division optical switch system with small fluctuation and low noise is realized.

What is claimed is:

1. A semiconductor light emitting device including:
   a double heterojunction structure including an active layer, a first cladding layer of a first conductivity type having a first band gap energy, and a cladding layer of a second conductivity type, opposite the first conductivity type, the cladding layers sandwiching the active layer;
   a second cladding layer of the first conductivity type interposed between the first cladding layer of the first conductivity type and the active layer, the second cladding layer of the first conductivity type having a second band gap energy and an energy barrier that suppresses passage of carriers with higher efficiency than does the first cladding layer of the first conductivity type; and
   a third cladding layer of the first conductivity type disposed within the first cladding layer of the first conductivity type at a position spaced from the second cladding layer of the first conductivity type by a distance longer than the diffusion length of carriers in the first cladding layer of the first conductivity type, the third cladding layer of the first conductivity type having a third band gap energy and an energy barrier that suppresses passage of carriers with lower efficiency than does the second cladding layer of the first conductivity type and higher efficiency than the first cladding layer of the first conductivity type.

2. The semiconductor light emitting device of claim 1 wherein the second band gap energy of the second cladding layer of the first conductivity type is equal to the third band gap energy of the third cladding layer of the first conductivity type, and the second cladding layer is thicker than the third cladding layer.

3. The semiconductor light emitting device of claim 2 wherein the first cladding layer of the first conductivity type and the cladding layer of the second conductivity type comprise InP, the second and third cladding layers of the first conductivity type comprise $Ga_xIn_{1-x}P$, and the active layer comprises InGaAsP.

4. The semiconductor light emitting device of claim 2 wherein the first cladding layer of the first conductivity type and the cladding layer of the second conductivity type comprise $Al_yGa_{1-y}As$, the second and third cladding layers of the first conductivity type comprise $Al_xGa_{1-x}As$ (x>y), and the active layer comprises AlGaAs.

5. The semiconductor light emitting device of claim 2 wherein the first cladding layer of the first conductivity type and the cladding layer of the second conductivity type comprise $Al_yGa_{1-y}As$, the second and third cladding layers of the first conductivity type comprise $Al_xGa_{1-x}As$ (x>y), and the active layer comprises an InGaAs/AlGaAs strained quantum well structure.

6. The semiconductor light emitting device of claim 2 wherein the first cladding layer of the first conductivity type and the cladding layer of the second conductivity type comprise $(Al_yGa_{1-y})_{0.5}In_{0.5}P$, the second and third cladding layers of the first conductivity type comprise $(Al_xGa_{1-x})_{0.5}In_{0.5}P$ (x>y), and the active layer comprises AlGaInP.

7. The semiconductor light emitting device of claim 1 wherein the second and third cladding layers of the first conductivity type have the same thickness, and the second band gap energy of the second cladding layer is larger than the third band gap energy of the third cladding layer.

8. The semiconductor light emitting device of claim 1 wherein the first cladding layer of the first conductivity type and the cladding layer of the second conductivity type comprise InP, the second cladding layer of the first conductivity type comprises $Ga_xIn_{1-x}P$, the third cladding layer of the first conductivity type comprises $Ga_yIn_{1-y}P$ (x>y), and the active layer comprises InGaAsP.

9. A semiconductor light emitting device comprising:
a p type InP substrate having opposite front and rear surfaces;
a mesa-shaped semiconductor multilayer structure including a p type InP cladding layer, an undoped InGaAsP active layer, and a first n type InP cladding layer, the mesa structure having opposite side surfaces;
a p type InP layer, an n type InP current blocking layer, and a p type InP current blocking layer, successively disposed on the front surface of the p type InP substrate and contacting the opposite side surfaces of the mesa structure;
an n type InGaAsP contact layer disposed on the p type InP current blocking layer and on the mesa structure;
an n side electrode disposed on the n type InGaAsP contact layer;
a p side electrode disposed on the rear surface of the p type InP substrate;
a second n type $Ga_xIn_{1-x}P$ cladding layer ($0 \leq x \leq 1$) interposed between the first n type InP cladding layer and the active layer, the second n type cladding layer having a thickness that suppresses passage of electrons; and
a third n type $Ga_xIn_{1-x}P$ ($0 \leq x \leq 1$) cladding layer ($0 \leq x \leq 1$) disposed within the first n type cladding layer at a position spaced from the second n type cladding layer by a distance longer than the diffusion length of electrons in the first n type cladding layer, the third n type cladding layer having a thickness that provides a smaller effect of suppressing passage of electrons than does the second n type cladding layer.

10. A laser amplifier including:
a double heterojunction structure having opposite facets and including an active layer, a first cladding layer of a first conductivity type comprising a material, and a cladding layer of a second conductivity type, opposite the first conductivity type, said cladding layers sandwiching the active layer, wherein laser light injected into the active layer is amplified;
low reflectivity coating layers disposed on the opposite facets of the double heterojunction structure;
a second cladding layer of the first conductivity type interposed between the first cladding layer of the first conductivity type and the active layer, the second cladding layer having an energy barrier that suppresses passage of carriers with higher efficiency than does the first cladding layer; and
a third cladding layer of the first conductivity type disposed within the first cladding layer of the first conductivity type at a position spaced from the second cladding layer of the first conductivity type by a distance longer than the diffusion length of carriers in the first cladding layer, the third cladding layer having an energy barrier that suppresses passage of carriers with lower efficiency than does the second cladding layer and higher efficiency than does the first cladding layer.

11. An integrated light amplifier and variable wavelength filter comprising:
a substrate of a first conductivity type;
a cladding layer of the first conductivity type disposed on the substrate;
a guide layer of the first conductivity type disposed on the first conductivity type cladding layer;
an active layer disposed on a part of the guide layer;
a first cladding layer of a second conductivity type, opposite the first conductivity type, disposed on the active layer and having a diffusion length for charge carriers;
a second cladding layer of the second conductivity type disposed on a part of the guide layer where the active layer is absent;
a third cladding layer of the second conductivity type interposed between the first cladding layer of the second conductivity type and the active layer, the third cladding layer having an energy barrier that suppresses passage of charge carriers with higher efficiency than does the first cladding layer;
a fourth cladding layer of the second conductivity type disposed within the first cladding layer of the second conductivity type at a position spaced from the third cladding layer of the second conductivity type by a distance longer than the diffusion length of charge carriers in the first cladding layer of the second conductivity type, the fourth cladding layer having an energy barrier than suppresses passage of charge carriers with lower efficiency than does the third cladding layer of the second conductivity type and higher efficiency than does the first cladding layer of the second conductivity type;
a light amplifier comprising the first conductivity type cladding layer, the guide layer, the active layer, the first, third, and fourth cladding layers of the second conductivity type, the amplifier amplifying laser light injected into the guide layer; and
a variable wavelength filter comprising the first conductivity type cladding layer, the guide layer, and the second cladding layer of the second conductivity type, the filter selecting a light component having a prescribed wavelength from the laser light injected into the guide layer.

12. The integrated light amplifier and variable wavelength filter of claim 11 wherein the first cladding layer of the second conductivity type and the first conductivity type cladding layer comprise InP, the second and third cladding layers of the second conductivity type comprise $Ga_xIn_{1-x}P$, and the active layer comprises InGaAsP.

* * * * *